US009595640B2

(12) United States Patent
Bae et al.

(10) Patent No.: US 9,595,640 B2
(45) Date of Patent: Mar. 14, 2017

(54) LIGHT EMITTING DEVICE, LIGHT EMITTING DEVICE PACKAGE AND LIGHT EMITTING MODULE

(71) Applicant: LG INNOTEK CO., LTD., Seoul (KR)

(72) Inventors: Seok Hun Bae, Seoul (KR); Seok Beom Choi, Seoul (KR); Pil Geun Kang, Seoul (KR); Deok Ki Hwang, Seoul (KR); Young Ju Han, Seoul (KR); Hee Seok Choi, Seoul (KR); Young Rok Park, Seoul (KR); Tae Don Lee, Seoul (KR); Hyun Sung Oh, Seoul (KR); Jee Hue Joo, Seoul (KR); Dong Woo Kang, Seoul (KR); Sung Sig Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/732,628

(22) Filed: Jan. 2, 2013

(65) Prior Publication Data
US 2013/0193464 A1    Aug. 1, 2013

(30) Foreign Application Priority Data

Jan. 3, 2012  (KR) .................. 10-2012-0000723
Jan. 3, 2012  (KR) .................. 10-2012-0000724

(51) Int. Cl.
*H01L 33/00* (2010.01)
*H01L 33/40* (2010.01)
(Continued)

(52) U.S. Cl.
CPC .......... *H01L 33/405* (2013.01); *H01L 33/486* (2013.01); *H01L 33/62* (2013.01);
(Continued)

(58) Field of Classification Search
CPC ....... H01L 24/16; H01L 33/50; H01L 33/405; H01L 33/486; H01L 33/62; H01L 33/20;
(Continued)

(56) References Cited

U.S. PATENT DOCUMENTS 5,569,939 A * 10/1996 Choi .............................. 257/94
6,903,381 B2 * 6/2005 Lin et al. ....................... 257/99
(Continued)

FOREIGN PATENT DOCUMENTS

| CN | 102263194 | 11/2011 |
|---|---|---|
| EP | 2 365 544 | 9/2011 |
| EP | 2 528 120 | 11/2012 |
| EP | 2 295 204 | 5/2013 |
| KR | 2010-0062603 | 6/2010 |

OTHER PUBLICATIONS

European Search Report for Application EP 13 15 0058 dated Feb. 25, 2016.

*Primary Examiner* — Trung Q Dang
*Assistant Examiner* — Patricia Reddington
(74) *Attorney, Agent, or Firm* — KED & Associates LLP

(57) ABSTRACT

Disclosed are a light emitting device, a light emitting device package and a light emitting module. The light emitting device includes a light emitting structure including a first conductive semiconductor layer, a second conductive semiconductor layer and an active layer between the first and second conductive semiconductor layers; a support member under the light emitting structure; a reflective electrode layer between the second conductive semiconductor layer and the support member; and first to third connection electrodes spaced apart from each other in the support member. The second connection electrode is disposed between the first and third connection electrodes, the first and third connection electrodes are electrically connected with each other, and the support member is disposed at a peripheral portion of the first to third connection electrodes.

19 Claims, 22 Drawing Sheets

(51) Int. Cl.
*H01L 33/48* (2010.01)
*H01L 33/62* (2010.01)
*H01L 33/20* (2010.01)
*H01L 33/38* (2010.01)
*H01L 33/44* (2010.01)
*H01L 33/64* (2010.01)

(52) U.S. Cl.
CPC ............ *H01L 33/20* (2013.01); *H01L 33/382* (2013.01); *H01L 33/44* (2013.01); *H01L 33/641* (2013.01); *H01L 2224/14* (2013.01); *H01L 2224/16225* (2013.01); *H01L 2224/16245* (2013.01); *H01L 2924/01322* (2013.01); *H01L 2924/1301* (2013.01)

(58) Field of Classification Search
CPC ..... H01L 33/382; H01L 33/44; H01L 33/641; H01L 2224/14; H01L 2224/16225; H01L 2224/16245; H01L 2924/01322; H01L 2924/0301
USPC ............................................ 257/94, E33.034
See application file for complete search history.

(56) References Cited

U.S. PATENT DOCUMENTS

| | | | |
|---|---|---|---|
| 6,977,396 B2* | 12/2005 | Shen et al. ..................... | 257/100 |
| 7,154,124 B2* | 12/2006 | Han et al. ....................... | 257/88 |
| 7,271,426 B2* | 9/2007 | Horio et al. .................... | 257/99 |
| 7,429,755 B2* | 9/2008 | Hsu ................................ | 257/81 |
| 7,456,438 B2* | 11/2008 | Lee et al. ........................ | 257/99 |
| 7,566,639 B2* | 7/2009 | Kohda ........................... | 438/463 |
| 7,875,473 B2* | 1/2011 | Fan et al. ........................ | 438/27 |
| 8,258,519 B2* | 9/2012 | Hsu ................................ | 257/79 |
| 2001/0010449 A1 | 8/2001 | Chiu et al. | |
| 2007/0284600 A1 | 12/2007 | Shchekin et al. | |
| 2010/0044743 A1 | 2/2010 | Liu et al. | |
| 2010/0117114 A1 | 5/2010 | Suzuki et al. | |
| 2011/0108865 A1 | 5/2011 | Aldaz et al. | |
| 2011/0198635 A1* | 8/2011 | Kim et al. ..................... | 257/98 |
| 2011/0227114 A1* | 9/2011 | Kim et al. ..................... | 257/98 |
| 2011/0291143 A1* | 12/2011 | Kim et al. ..................... | 257/98 |
| 2012/0261689 A1 | 10/2012 | Appelt et al. | |
| 2013/0119424 A1* | 5/2013 | Kang et al. ..................... | 257/98 |

* cited by examiner

LIGHT EMITTING DEVICE, LIGHT EMITTING DEVICE PACKAGE AND LIGHT EMITTING MODULE

The present application claims priority under 35 U.S.C. §119(a) of Korean Patent Application Nos. 10-2012-0000723 and 10-2012-0000724 filed on Jan. 3, 2012, which is hereby incorporated by reference in their entirety.

BACKGROUND

The embodiment relates to a light emitting device, a light emitting device package, and a light emitting module.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device having a novel structure.

The embodiment provides a wafer-level packaged light emitting device.

The embodiment provides a light emitting device including a support member having a ceramic-based additive disposed around first and second electrodes.

The embodiment provides a light emitting device in which plurality of connection electrodes having a first polarity are embedded in a support member that supports a light emitting structure.

The embodiment provides a light emitting device in which first connection electrodes having a first polarity are disposed between plurality of second connection electrodes having the first polarity.

The embodiment provides a light emitting device package having the light emitting device and a light emitting module.

A light emitting device according to the embodiment includes a light emitting structure including a first conductive semiconductor layer, a second conductive semiconductor layer under the first conductive semiconductor layer and an active layer between the first and second conductive semiconductor layers; a support member under the light emitting structure; a reflective electrode layer between the second conductive semiconductor layer and the support member; and first to third connection electrodes spaced apart from each other in the support member, wherein the second connection electrode is disposed between the first and third connection electrodes, the first and third connection electrodes are electrically connected with each other and are electrically insulated from the second connection electrode, and the support member is disposed at a peripheral portion of the first to third connection electrodes.

A light emitting device according to the embodiment includes a transparent substrate; a support member under the transparent substrate; a light emitting structure disposed between the transparent substrate and the support member and including a first conductive semiconductor layer, a second conductive semiconductor layer and an active layer between the first and second conductive semiconductor layers; a reflective electrode layer between the second conductive semiconductor layer and the support member; and first to third connection electrodes spaced apart from each other in the support member, wherein the second connection electrode is disposed between the first and third connection electrodes, the first and third connection electrodes are electrically connected with each other and are electrically insulated from the second connection electrode, and the support member is disposed at a peripheral portion of the first to third connection electrodes.

A light emitting device package according to the embodiment includes a body having a cavity; a first lead electrode in the cavity of the body; a third lead electrode in the cavity of the body; a second lead electrode disposed between the first and third lead electrodes in the cavity; a light emitting device disposed on the first to third lead electrodes and electrically connected to the first to third lead electrodes; and gap portions interposed among the first to third lead electrodes, wherein the light emitting device includes a light emitting structure including a first conductive semiconductor layer, a second conductive semiconductor layer and an active layer between the first and second conductive semiconductor layers; a support member under the light emitting structure; a reflective electrode layer between the second conductive semiconductor layer and the support member; and first to third connection electrodes spaced apart from each other in the support member, and wherein the second connection electrode is disposed between the first and third connection electrodes, the first and third connection electrodes are electrically connected with each other and are electrically insulated from the second connection electrode, the support member is disposed at a peripheral portion of the first to third connection electrodes; and the first to third lead electrodes are spaced apart from the support member and the first to third connection electrodes at a same interval.

DETAILED DESCRIPTION OF THE EMBODIMENTS

Figure 1:
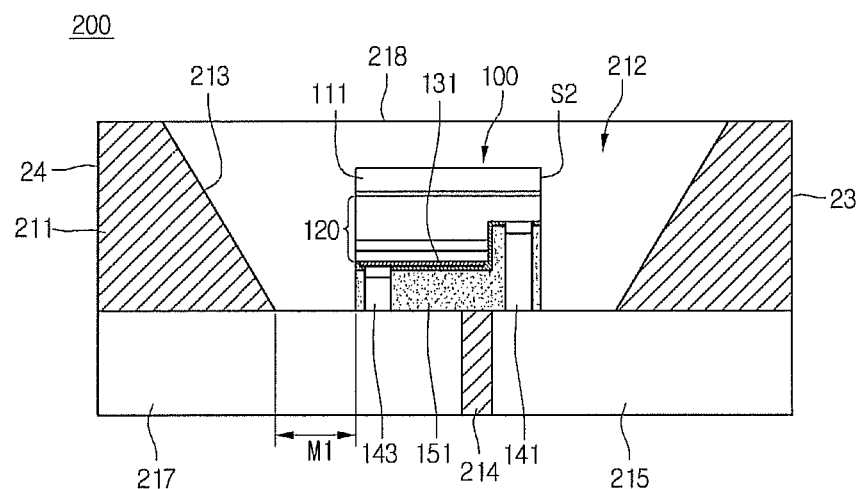
FIG. 1 is a side sectional view showing a light emitting device package having a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings.

Figure 2:
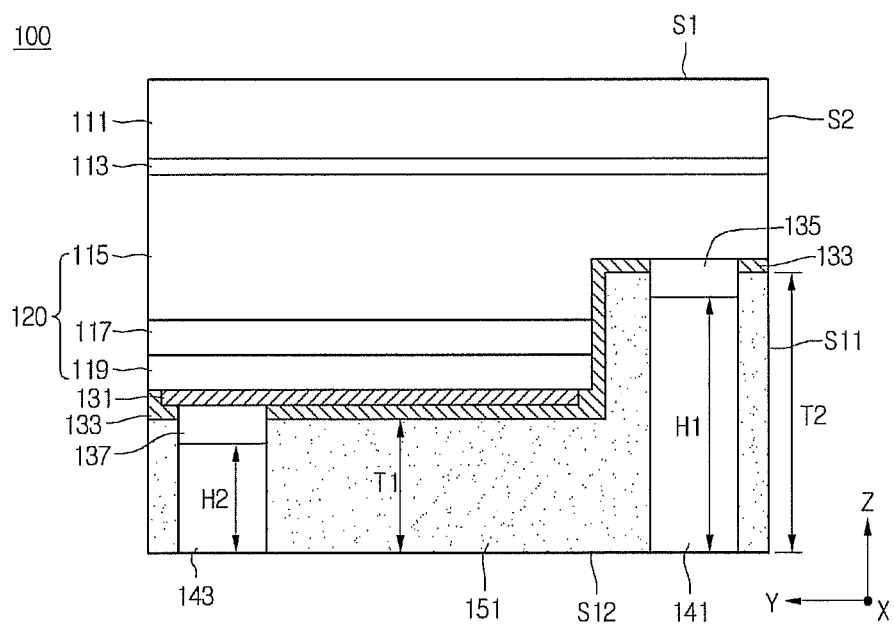
FIG. 2 is a side sectional view of a light emitting device shown in FIG. 1.
Figure 3:
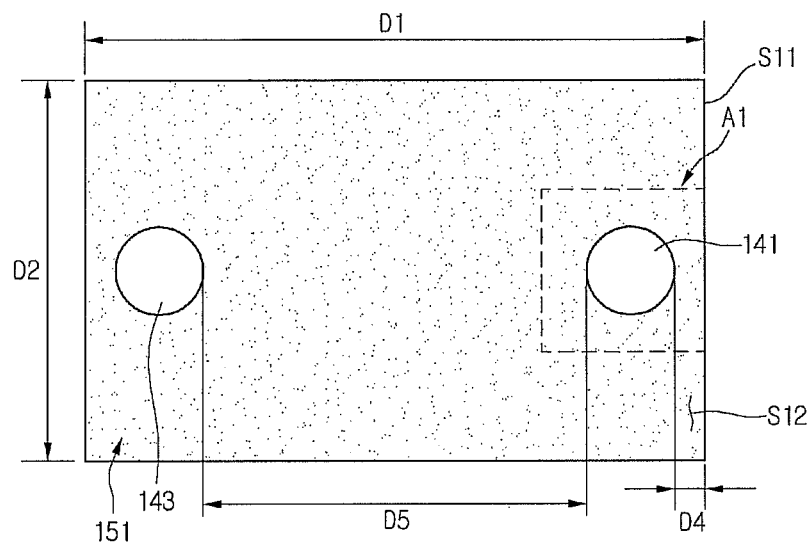
FIG. 3 is a bottom view of a light emitting device shown in FIG. 2.

FIG. 1 is a side sectional view showing a light emitting device package having a light emitting device according to the first embodiment, FIG. 2 is a side sectional view of the light emitting device shown in FIG. 1 and FIG. 3 is a bottom view of the light emitting device shown in FIG. 2.

Referring to FIG. 1, the light emitting device package 200 includes a body 211 having a cavity 212, first and second lead electrodes 215 and 217 at least a part of which is disposed in the cavity 212, and a light emitting device 100.

The body 211 may include an insulating material or a conductive material. The body 121 may include at least one of a resin material, such as polyphthalamide (PPA) or polycyclohexylene terephthalate (PCT), silicon (Si), a metallic material, photosensitive glass (PSG), sapphire ($Al_2O_3$), and a printed circuit board (PCB). For example, the body 211 may be injection-molded by using a resin material such as epoxy or silicon.

The body 211 may be formed by using a material that reflects 50% or more of light emitted from the light emitting device 100. In addition, the body 211 may be formed by using a material that transmits 50% or more of light emitted from the light emitting device 100.

The body 211 includes an epoxy molding compound (EMC) material having epoxy, and the EMC material represents improved formability, improved moisture resistance, and an improved adhesive property, and includes an insulating material. The body 211 may have a filler, which includes a metallic oxide, such as $TiO_2$ or $SiO_2$, in order to enhance a reflection efficiency. The filler having the contents of at least 10 wt %, for example, at least 15 wt % may be contained in the body 211. The body 211 may include a reflective material for light reflection, or may include a transparent material to widen the distribution of light orientation angles, but the embodiment is not limited thereto.

According to another embodiment, the body 211 may include a resin substrate or a ceramic substrate and can be formed as a single-layer substrate or a multi-layer substrate.

The cavity 212 of the body 211 is a light exit region and a top surface of the cavity 212 is open. A sidewall 213 of the cavity 212 is inclined or vertical to a bottom surface of the cavity 212. If the sidewall 213 of the cavity 212 is inclined, the inclination angle is in the range of 5° to 90° with respect to the bottom surface of the cavity 212. The sidewall 213 of the cavity 212 may be closer to a support member 151 of the light emitting device 100 than to a substrate 111. A bottom surface of the cavity 212 may serve as top surfaces of the first and second lead electrodes 215 and 217, but the embodiment is not limited thereto.

At least a part of the first and second lead electrodes 215 and 217 is disposed in the cavity 212. A part of the first electrode 215 is exposed to the bottom of the cavity 212 while extending in the body 211. The first and second lead electrodes 215 and 217 may include a metallic material including at least one of Ti, Cu, Ni, Au, Cr, Ta, Pt, Sn Ag, P and Al. In addition, the first and second lead electrodes 215 and 217 may be prepared as a lead frame having a single-layer structure or a multi-layer structure, but the embodiment is not limited thereto. The first and second lead electrodes 215 and 217 may have a thickness in the range of 0.8 mm to 3 mm, but the embodiment is not limited thereto.

A part of the second lead electrode 217 is exposed to the bottom of the cavity 212 while extending in the body 211. The first and second lead electrodes 215 and 217 may be exposed to the bottom surface of the body 211, but the embodiment is not limited thereto. The bottom surfaces of the first and second lead electrodes 215 and 217 are aligned on the same plane with the bottom surface of the body 211 so as to be easily mounted on the circuit board, but the embodiment is not limited thereto. In addition, the bottom surfaces of the first and second lead electrodes 215 and 217 may be aligned higher or lower than the bottom surface of the body 211. At least a part of the first and second lead electrodes 215 and 217 may include a bending structure, but the embodiment is not limited thereto. A rough surface may be formed on at least one surface of the first and second lead electrodes 215 and 217 to increase a contact area between the body 211 and a gap portion 214. Thus, a light emitting device package having superior wet-resistance can be provided.

According to another embodiment, a concave portion is formed at the bottom of the cavity 212 and the first and second lead electrodes 215 and 217 are disposed in the concave portion. Lower electrodes of the light emitting device 100 may be electrically connected to each other in the concave portion. The concave portion may have a depth lower than a distance between a bottom surface of a support member of the light emitting device 100 and an active layer and higher than a distance between a top surface of the support member and the active layer.

A first terminal of the first lead electrode 215 is disposed or protruded under a first lateral side 23 of the body 211. A second terminal of the second lead electrode 217 is disposed or protruded under a second lateral side 24 of the body 211.

The light emitting device 100 is bonded onto the first and second lead electrodes 215 and 217 through the flip scheme. In detail, a first connection electrode 141 of the light emitting device 100 is bonded onto the first lead electrode 215 and a second connection electrode 143 of the light emitting device 100 is bonded onto the second lead electrode 217. The first connection electrode 141 is bonded to the first lead electrode 215 through direct bonding, such as eutectic bonding, or through a bonding member, such as a solder. The first connection electrode 141 is bonded to the second lead electrode 217 through direct bonding, such as eutectic bonding, or through a bonding member, such as a solder.

An interval between the first lead electrode 215 and the first connection electrode 141 is equal to an interval between the second lead electrode 217 and the second connection electrode 143. In addition, the support member 151 of the light emitting device 100 is disposed corresponding to the top surfaces of the first and second lead electrodes 215 and 217 and may be spaced apart from the first and second lead electrodes 215 and 217 at the same interval.

The support member 151 of the light emitting device 100 directly or indirectly makes contact with the top surfaces of the first and second lead electrodes 215 and 217 so that the heat conduction is achieved through the first and second lead electrodes 215 and 217. A least one of the first and second connection electrodes 141 and 143 may be a plural in number thereof. A plurality of first connection electrodes 141 and/or a plurality of second connection electrodes 143 may increase an electric bonding region with respect to the first lead electrode 215 and/or the second lead electrode 217. Thus, the heat conductive efficiency of the light emitting device 100 can be improved.

In addition, an interval M1 between the sidewall 213 of the cavity 212 and a lateral side S2 of the light emitting device may be equal to or narrower than a width D1 of the light emitting device 100. That is, since the light emitting device 100 is flip-bonded, a wire or a process for connecting the light emitting device 100 using the wire may not be necessary and a bonding area (for example, 150 μm×150 μm) of the wire may not be necessary. Thus, the interval M1 between the light emitting device 100 and the sidewall 213 of the cavity 212 can be more reduced so that the size of the body 211 can be reduced. The interval M1 may vary depending on the position of the sidewall 213 and may be more than 1 μm, for instance, in the range of 0.01 μm to 2 mm. Since there is no light interference by the wire in the cavity 212, the distribution of the orientation angle of the light can be adjusted by controlling the interval M1.

A molding member 218 is disposed in the cavity 212. The molding member 218 includes a transparent resin material, such as silicon or epoxy. The molding member 218 may include a phosphor. The molding member 218 may include at least one transparent resin layer and the phosphor makes contact with the top surface of the light emitting device 100 or is spaced apart from the top surface of the light emitting device 100. The phosphor includes one selected from the group consisting of YAG, TAG, silicate, nitride, and oxy-nitride-based material. For instance, the phosphor includes at least one of a red phosphor, a yellow phosphor and a green phosphor. When the light emitting device having luminescence phosphor layer is mounted, the phosphor material may not be additionally added to the molding member 218 in the light emitting device package 200 and mutually different phosphors or phosphors that emit similar colors can be added.

The light emitting device 100 can selectively emit the light having a predetermined wavelength in the range of an ultraviolet (UV) ray band to a visible ray band. For instance, the light emitting device 100 may be selected from a red LED chip, a blue LED chip, a green LED chip, a yellow green LED chip, a UV LED chip, and a white LED chip. The light emitting device 100 includes an LED chip having at least one of group III-V compound semiconductors and group II-VI compound semiconductors.

A protective chip (not shown) may be disposed in the light emitting device package 200. The protective chip may include a thyristor, a Zener diode or a TVS (transient voltage suppression), but the embodiment is not limited thereto.

The light generated from the light emitting structure 120 of the light emitting device 100 is emitted through the top surface and the side surfaces of the light emitting device 100 and the emitted light may be discharged to the outside through the molding member 218.

FIG. 2 is a side sectional view of the light emitting device of the light emitting device package according to the first embodiment, and FIG. 3 is a bottom view of the light emitting device shown in FIG. 2.

Referring to FIGS. 2 and 3, the light emitting device 100 includes a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, and a support member 151.

The substrate 111 may include a transparent substrate, an insulating substrate or a conductive substrate. For instance, the substrate 111 may include at least one of $Al_2O_3$, SiC, Si, GaAs, GaN, ZnO, Si, GaP, InP, Ge, and $Ga_2O_3$. A transparent substrate will be described as an example of the substrate 111 for the purpose of light extraction. A light extracting structure, such as a concavo-convex pattern, may be formed on the bottom surface of the substrate 111 between the substrate 111 and the first semiconductor layer 113. The concavo-convex pattern can be formed by etching the substrate 111 or forming a roughness on the substrate 111. The concavo-convex pattern may have a stripe shape or a convex lens shape. The substrate 111 may be a transparent substrate having a light exit surface and may have a thickness in the range of 30 μm to 300 μm.

The first semiconductor layer 113 may be formed on the bottom surface of the substrate 111. The first semiconductor layer 113 may include a compound semiconductor that selectively includes group II to VI compound semiconductors. In detail, the first semiconductor layer 113 can be formed in a single layer structure or a multi-layer structure by using the group II to VI compound semiconductors. The first semiconductor layer 113 may be formed of group III-V compound semiconductors from among the group II to VI compound semiconductors. For instance, the first semiconductor layer 113 includes at least one of GaN, InN, AlN, InGaN, AlGaN, InAlGaN and AlInN. The first semiconductor layer 113 may include an oxide, such as ZnO, but the embodiment is not limited thereto.

The first semiconductor layer 113 may include a buffer layer. The buffer layer can attenuate the lattice mismatch between the substrate and the nitride semiconductor layer. The first semiconductor layer 113 may include an undoped semiconductor layer. The undoped semiconductor layer may be prepared as a GaN-based semiconductor layer including the group III-V compound semiconductor. The undoped semiconductor layer may have a first conductive property even if the conductive dopant is not intentionally added in the manufacturing process. In addition, the undoped semiconductor layer has a dopant concentration lower than that of the conductive dopant of the first conductive semiconductor layer 115. The first semiconductor layer 113 may include at least one of the buffer layer and the undoped semiconductor layer, but the embodiment is not limited thereto.

A light emitting structure 120 may be formed under the first semiconductor layer 113. The light emitting structure 120 includes the group III-V compound semiconductor from among the group II-VI compound semiconductors. For instance, the light emitting structure 120 includes the semiconductor having the compositional formula of $In_xAl_yGa_{1-x-y}N$ ($0 \leq x \leq 1$, $0 \leq y \leq 1$, $0 \leq x+y \leq 1$) and can emit the light having a predetermined peak wavelength in the wavelength range of an ultraviolet ray band to a visible ray band.

The light emitting structure 120 includes the first conductive semiconductor layer 115, the second conductive semiconductor layer 119, and the active layer 117 between the first conductive semiconductor layer 115 and the second conductive semiconductor layer 119.

The first conductive semiconductor layer 115 is disposed between the substrate 111 and the active layer 117. The first conductive semiconductor layer 115 may include a group III-V compound semiconductor doped with a first conductive dopant. The first conductive semiconductor layer 115 is an n type semiconductor layer having the compositional formula of $In_xAl_yGa_{1-x-y}N$ ($0 \leq x \leq 1$, $0 \leq y \leq 1$, $0 \leq x+y \leq 1$) and the first conductive dopant is an n type dopant including Si, Ge, Sn, Se or Te.

A superlattice structure including various semiconductor layers alternately stacked on each other may be formed between the first conductive semiconductor layer 115 and the first semiconductor layer 113. The superlattice structure may reduce the lattice defect. Each layer of the superlattice structure may have a thickness of about few Å or more.

A first conductive clad layer (not shown) may be formed between the first conductive semiconductor layer 115 and the active layer 117. The first conductive clad layer may include a GaN-based semiconductor and have a bandgap higher than that of the active layer 117. The first conductive clad layer confines the carriers.

The active layer 117 is formed under the first conductive semiconductor layer 115. The active layer 117 selectively includes a single quantum well structure, a multiple quantum well (MQW) structure, a quantum wire structure or a quantum dot structure and may have a periodicity of the well layer and the barrier layer. The well layer may have a compositional formula of $In_xAl_yGa_{1-x-y}N$ ($0 \leq x \leq 1$, $0 \leq y \leq 1$, $0 \leq x+y \leq 1$) and the barrier layer may have a compositional formula of $In_xAl_yGa_{1-x-y}N$ ($0 \leq x \leq 1$, $0 \leq y \leq 1$, $0 \leq x+y \leq 1$).

The well layer/barrier layer may have at least one periodicity by using the stack structure of InGaN/GaN, GaN/AlGaN, InGaN/AlGaN, InGaN/InGaN, InAlGaN/InAlGaN, or AlInN/InGaN. The barrier layer may include a semiconductor material having a bandgap higher than that of the well layer.

The second conductive semiconductor layer 119 is formed under the active layer 117. The second conductive semiconductor layer 119 may include a semiconductor doped with a second conductive dopant. For instance, the second conductive semiconductor layer 119 may include a compound semiconductor, such as GaN, InN, AlN, InGaN, AlGaN, InAlGaN, or AlInN. The second conductive semiconductor layer 119 is a p type semiconductor layer having a compositional formula of $In_xAl_yGa_{1-x-y}N$ ($0 \leq x \leq 1$, $0 \leq y \leq 1$, $0 \leq x+y \leq 1$) and the second conductive dopant is a p type dopant, such as Mg, Zn, Ca, Sr or Ba.

The second conductive semiconductor layer 119 may include a superlattice structure, such as InGaN/GaN or AlGaN/GaN. The superlattice structure of the second conductive semiconductor layer 119 may spread the current abnormally contained in the voltage, thereby protecting the active layer 117. A second clad layer and/or an electron blocking layer (not shown) may be disposed between the second conductive semiconductor layer 119 and the active layer 117. The second clad layer may have a bandgap higher than that of the electron blocking layer and confine the carriers. In addition, the electron blocking layer may include AlGaN-based material and serves as a barrier for electrons.

In addition, the first conductive semiconductor layer 115 may be prepared as a p type semiconductor layer and the second conductive semiconductor layer 119 may be prepared as an n type semiconductor layer. A third conductive semiconductor layer having polarity opposite to that of the second conductive semiconductor layer 119 may be formed under the second conductive semiconductor layer 119.

The light emitting structure 120 of the light emitting device 100 may be defined by the first conductive semiconductor layer 115, the active layer 117 and the second conductive semiconductor layer 119. The light emitting structure 120 may have one of an n-p junction structure, a p-n junction structure, an n-p-n junction structure, and a p-n-p junction structure. In this case, the symbols "n" and "p" represent n and p type semiconductor layers, respectively, and the symbol "-" represents that two layers are directly or indirectly stacked on each other. Hereinafter, the second conductive semiconductor layer 119 will be referred to as the uppermost layer of the light emitting structure 120 for the purpose of convenience of explanation.

The reflective electrode layer 131 is disposed under the second conductive semiconductor layer 119. The reflective electrode layer 131 includes at least one of an ohmic contact layer, a reflective layer, a diffusion barrier layer and a protective layer. The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, the reflective layer/diffusion barrier, or the reflective layer.

The ohmic contact layer makes contact with the bottom surface of the second conductive semiconductor layer 119, in which the contact area of the ohmic contact layer corresponds to 70% or more based on the bottom surface area of the second conductive semiconductor layer 119. The ohmic contact layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, RuOx, NiO, Ni, Cr and a compound or an alloy thereof. The ohmic contact layer may include at least one layer having a thickness of about 1 to 1,000 Å.

The reflective layer formed under the ohmic contact layer may include a material having reflectivity of about 70% or above. For instance, the reflective layer may include one selected from the group consisting of Al, Ag, Ru, Pd, Rh, Pt, Ir and an alloy having at least two of the above elements. A metal of the reflective layer makes ohmic-contact with the bottom surface of the second conductive semiconductor layer 119. In this case, the ohmic contact layer can be omitted. The reflective layer may have a thickness of about 1 to 10,000 Å.

The diffusion barrier layer may include one selected from the group consisting of Au, Cu, Hf, Ni, Mo, V, W, Rh, Ru, Pt, Pd, La, Ta, Ti and an alloy having at least two of the above elements. The diffusion barrier layer prevents the interlayer diffusion at the boundary region between two different layers. The diffusion barrier layer may have a thickness of about 1 to 10,000 Å.

The protective layer may include one selected from the group consisting of Au, Cu, Hf, Ni, Mo, V, W, Rh, Ru, Pt, Pd, La, Ta, Ti and an alloy having at least two of the above elements. The protective layer may have a thickness of about 1 to 10,000 Å.

The light travelling downward from the light emitting structure 120 is reflected from the reflective electrode layer 131 including a reflective metal disposed between the light emitting structure 120 and the support member 151, so that the light extraction efficiency can be improved. A transparent insulating layer may be further disposed between the reflective electrode layer 131 and the light emitting structure 120. The transparent insulating layer may diffuse the light travelling downward from the light emitting structure 120 so that the light can be transferred to the reflective electrode layer 131.

The reflective electrode layer 131 may include the stack structure of a transparent electrode layer/a reflective layer. The transparent electrode layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and RuOx. The reflective layer may be formed under the transparent electrode layer. The reflective layer includes a first layer having a first refractive index and a second layer having a second refractive index. The reflective layer may include the stack structure in which at least two pairs of the first and second layers are alternately stacked. The first refractive index is different from the second refractive index and the first and second layers may include a material having the refractive index in the range of 1.5 to 2.4. For instance, the first and second layers may include a conductive material or an insulating material. Such a structure may be defined as a DBR (distributed bragg reflection) structure.

A light extracting structure, such as a roughness or a concavo-convex pattern, can be formed on a surface of at least one of the second conductive semiconductor layer 119 and the reflective electrode layer 131. The light extracting structure may vary the critical angle of the incident light to improve the light extraction efficiency.

The first electrode 135 is formed under a local region A1 of the first conductive semiconductor layer 115 and the second electrode 137 is formed under a predetermined region of the reflective electrode layer 131. The first connection electrode 141 is formed under the first electrode 135 and the second connection electrode 143 is formed under the second electrode 137. The first electrode 135 and the second connection electrode 141 may be defined as a first electrode member and the second electrode 137 and the second connection electrode 143 may be defined as a second electrode member. In addition, the first and second connection electrodes 141 and 143 may be defined as via electrodes disposed in the support member 151, but the embodiment is not limited thereto.

The first electrode 135 is electrically connected to the local region A1 of the first conductive semiconductor layer 115. The first electrode 135 may include an electrode pad, but the embodiment is not limited thereto. Besides the local region A1, the first electrode 135 and the second connection electrode 141 may be extend to a region under the reflective electrode layer 131. The second electrode 137 may extend to the insulating layer 133 disposed under the reflective electrode layer 131 and may be connected to at least one second connection electrode 143.

The first and second electrodes 135 and 137 may have thickness smaller than that of the first and second connection electrodes 141 and 143.

The first electrode 135 is spaced apart from the lateral sides of the active layer 117 and the second conductive semiconductor layer 119 and has an area smaller than the local region A1 of the first conductive semiconductor layer 115.

The second electrode 137 may be connected to at least one of the reflective electrode layer 131 and the second conductive semiconductor layer 119. The second electrode 137 may be physically and/or electrically connected to the second conductive semiconductor layer 119. The second electrode 137 includes an electrode pad. One or a plurality of second electrodes 137 and second connection electrodes 143 may be formed under the reflective electrode layer 131, but the embodiment is not limited thereto. The first and second electrodes 135 and 137 may include one of Ag, Al, Ru, Rh, Pt, Pd, Ni, Mo, W, La, Ta, Ti and an alloy thereof.

The first and second electrodes 135 may have the same stack structure or mutually different stack structures. The stack structure of the second electrode 137 may be smaller than the stack structure of the first electrode 135. For instance, the first electrode 135 may have the stack structure of the adhesive layer/reflective layer/diffusion barrier layer/bonding layer or the adhesive layer/diffusion barrier layer/bonding layer, and the second electrode 137 may have the stack structure of the adhesive layer/reflective layer/diffusion barrier layer/bonding layer or the adhesive layer/diffusion barrier layer/bonding layer.

A top surface area of the second electrode 137 is equal to a bottom surface area of the reflective electrode layer 131 or at least larger than a top surface area of the second connection electrode 143.

At least one of the first and second electrodes 135 and 137 may include a current spreading pattern having an arm structure or a finger structure branching from the electrode pad. In addition, the first and second electrodes 135 and 137 may include one electrode pad or a plurality of electrode pads, but the embodiment is not limited thereto.

The first and second connection electrodes 141 and 143 may serve as a lead for supplying power and a heat dissipation path. The first and second connection electrodes 141 and 143 may have a column shape. For instance, the first and second connection electrodes 141 and 143 may have a spherical shape, a cylindrical shape, a polygonal column shape or a random shape. The polygonal column shape may be an equiangular column shape or not, and the embodiment is not limited thereto. The top and bottom surfaces of the first and second connection electrodes 141 and 143 may have a circular shape or a polygonal shape, but the embodiment is not limited thereto. The bottom surface area of the first and second connection electrodes 141 and 143 may be different from the top surface area of the first and second connection electrodes 141 and 143. For instance, the bottom surface area of the first and second connection electrodes 141 and 143 may be larger or smaller than the top surface area of the first and second connection electrodes 141 and 143.

One of the first and second connection electrodes 141 and 143 is smaller than a width of a bottom surface of the light emitting structure 120 and larger than a diameter or a width of a bottom surface of the first and second electrodes 135 and 137.

The diameter or the width of the first and second connection electrodes 141 and 143 is in the range of 1 μm~100,000 μm and the height of first and second connection electrodes 141 and 143 is in the range of 1 μm~100,000 μm. The height H1 of the first connection electrode 141 may be longer than the height H2 of the second connection electrode 143 and bottom surfaces of the first and second connection electrodes 141 and 143 may be aligned on the same plane (that is, horizontal plane).

The first and second connection electrodes 141 and 143 may be prepared as a single layer by using one metal or an alloy. The width and the height of the single layer is in the range of 1 μm~100,000 μm. For instance, the single layer has the thickness larger than the thickness of the second connection electrode 143.

The first and second connection electrodes 141 and 143 may include one selected from the group consisting of Ag, Al, Au, Cr, Co, Cu, Fe, Hf, In, Mo, Ni, Si, Sn, Ta, Ti, W and an alloy thereof. In order to improve the adhesive strength with respect to the first and second electrodes 135 and 137, the first and second connection electrodes 141 and 143 may be plated with a metal including one selected from the group consisting of In, Sn, Ni, Cu and an alloy thereof. At this time, the plating thickness may be in the range of 1 Å~100,000 Å.

A plating layer can be further formed on the surfaces of the first and second connection electrodes 141 and 143. The plating layer may include Tin or an alloy thereof, Ni or an alloy thereof, or Tin-Ag—Cu. At this time, the plating layer may have a thickness of about 0.5 μm~10 μm. The plating layer can improve the bonding strength with respect to other bonding layers.

The insulating layer 133 may be formed under the reflective electrode layer 131. In detail, the insulating layer 133 can be formed on the bottom surface of the second conductive semiconductor layer 119, lateral sides of the second conductive semiconductor layer 119 and the active layer 117, and the bottom surface of the predetermined region A1 of the first conductive semiconductor layer 115. The insulating layer 133 is formed on the lower region of the light emitting structure 120 except for the region for the reflective electrode layer 131, the first electrode 135 and the second electrode 137 to electrically protect the lower portion of the light emitting structure 120.

The insulating layer 133 includes an insulating material or an insulating resin formed by using oxide, nitride, fluoride or sulfide including at least one of Al, Cr, Si, Ti, Zn and Zr. For instance, the insulating layer 133 may include one selected from the group consisting of $SiO_2$, $Si_3N_4$, $Al_2O_3$ and $TiO_2$. The insulating layer 133 may be prepared as a single layer or multiple layers, but the embodiment is not limited thereto. The insulating layer 133 prevents the layer-to-layer short of the light emitting structure 120 when a metal structure is formed under the light emitting structure for the purpose of flip bonding.

The insulating layer 133 can be formed only on the surface of the light emitting structure 120 without being formed on the bottom surface of the reflective electrode layer 131. Since the support member 151 having the insulating property is formed on the bottom surface of the reflective electrode layer 131, the insulating layer 133 may not need to extend to the bottom surface of the reflective electrode layer 131.

The insulating layer 133 has the DBR structure in which the first and second layers having refractive indexes different from each other are alternately aligned. In detail, the first layer includes one of $SiO_2$, $Si_3N_4$, $Al_2O_3$, and $TiO_2$ and the second layer includes materials except for the materials of the first layer. In this case, the reflective electrode layer may be omitted.

The insulating layer 133 may have the thickness in the range of 100 to 10,000 Å. If the insulating layer 133 is prepared as the multiple layers, each layer may have the thickness in the range of 1 to 50,000 Å or 100 to 10,000 Å. The thickness of each layer of the insulating layer 133 having the multiple layers may vary the reflective efficiency according to the emission wavelength.

The first and second connection electrodes 141 and 143 may include Ag, Al, Au, Cr, Co, Cu, Fe, Hf, In, Mo, Ni, Si, Sn, Ta, Ti, W and an alloy thereof. In addition, the first and second connection electrodes 141 and 143 may have a plating layer including In, Sn, Ni, Cu and an alloy thereof to improve the adhesive strength with respect to the first and second electrodes 135 and 137. In this case, the plating layer has the thickness in the range of 1 Å-100,000 Å. The first and second connection electrodes 141 and 143 may be used as a solder ball or a metal bump, but the embodiment is not limited thereto.

The support member 151 is disposed under the light emitting device 100 and serves as a support layer to support the light emitting device 100. The support member 151 may physically make contact with the first and second electrodes 135 and 137, the insulating layer 133, and the first and second connection electrodes 141 and 143. The support member 151 vertically overlaps with the light emitting structure 120 under the light emitting structure 120. In addition, the support member 151 may not protrude outward beyond the lateral side of the light emitting structure 120 under the light emitting structure 120. Further, the entire top surface of the support member 151 is located lower than the light emitting structure 120.

The support member 151 includes an insulating material. For instance, the insulating material may be a resin including silicon or epoxy. In addition, the insulating material may include paste or insulating ink. The insulating material may also include a resin selected from the group consisting of a polyacrylate resin, an epoxy resin, a phenolic resin, a polyamides resin, a polyimide resin, an unsaturated polyesters resin, a polyphenylene ether resin (PPE), a polyphenylene oxide resin (PPO), a polyphenylene sulfides resin, a cyanate ester resin, benzocyclobutene (BCB), Polyamidoamine Dendrimers (PAMAM), Polypropylene-imine, Dendrimers (PPI), PAMAM-OS (organosilicon) having an internal structure of PAMAM and an outer surface of organosilicon, and a combination thereof. The material for the support member 151 may be different from the material for the insulating layer 133.

At least one of compounds, such as oxide, nitride, fluoride or sulfide including at least one of Al, Cr, Si, Ti, Zn and Zr, can be added to the support member 151. The compound added to the support member 151 may be a thermal diffusion agent (not shown). The thermal diffusion agent is a powder particle having a predetermined size, a grain, filler or an additive. In the following description, the support member 151 including the thermal diffusion agent will be described for the purpose of convenience of the explanation. The thermal diffusion agent may include an insulating material or a conductive material having a size of 1 Å-100,000 Å. In order to improve the thermal diffusion efficiency, the thermal diffusion agent may have a size of 1,000 Å-50,000 Å. The grain of the thermal diffusion agent may have a spherical shape or an irregular shape, but the embodiment is not limited thereto.

The thermal diffusion agent may include a material having thermal conductivity higher than that of the insulating material constituting the support member 151. The thermal diffusion agent includes a ceramic material. The ceramic material includes at least one of LTCC (low temperature co-fired ceramic), HTCC (high temperature co-fired ceramic), alumina, quartz, calcium zirconate, forsterite, SiC, graphite, fused-silica, mullite, cordierite, zirconia, beryllia, and aluminum nitride. The ceramic material may include metal nitride having thermal conductivity higher than that of nitride or oxide. For instance, the metal nitride may include a material having the thermal conductivity equal to or higher than 140 W/mK. For example, the ceramic material includes one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermal conductive material may include C-component, such as diamond or CNT.

The support member 151 can be prepared as a single layer structure or a multi-layer structure. When the support member 151 is prepared as a multi-layer structure, a lower support member is formed under an upper support member. The support member 151 is provided therein with ceramic powder, so the strength and the thermal conductivity of the support member 151 can be improved.

In addition, the amount of the thermal diffusion agent added to the resin material of the support member 151 may be 1~99 wt %. In order to improve the thermal diffusion efficiency, 50~99 wt % of the thermal diffusion agent can be added to the support member 151. Since the thermal diffusion agent is added to the support member 151, the thermal conductivity can be more improved at the interior of the support member 151. In addition, the support member 151 has the thermal expansion coefficient of 4-11 [x106/° C.]. The above thermal expansion coefficient is equal or similar to the thermal expansion coefficient of the substrate 111, such as the sapphire substrate, so the wafer may not be warped or damaged caused by the difference in the thermal expansion coefficient between the support member 151 and the light emitting structure 120 formed on the substrate, thereby improving the reliability of the light emitting device.

The bottom surface of the support member 151 is an opposite surface to the top surface of the substrate 111 and bottom surface of the support member 151 may correspond to or in parallel to the top surface of the substrate 111. The bottom surface area of the support member 151 is substantially equal to the top surface area of the support member 151. In addition, the bottom surface area of the support member 151 is equal to the top surface area of the first conductive semiconductor layer 115. Further, the width of the bottom surface of the support member 151 may be equal to the width of the top surface of the substrate 111 and the width of the top surface of the semiconductor layer 115. Thus, since the individual chips are divided after the support member 151 has been formed, the lateral sides of the support member 151, the substrate 111 and the first conductive semiconductor layer 115 can be aligned on the same plane. According to another embodiment, the bottom surface area of the support member 151 may be larger than or narrower than the area of the top surface S1 of the substrate 111, but the embodiment is not limited thereto.

One lateral side S11 of the support member 151 may be aligned on the same plane with one lateral side S2 of the substrate 111 and may be aligned vertically to the bottom surface S12 of the support member 151.

Referring to FIG. 3, a length D1 of a first lateral side among lateral sides S11 of the support member 151 is substantially the same as a length of a first lateral side of the substrate 111 corresponding to the first lateral side of the support member 151. In addition, a length D2 of a second lateral side among the lateral sides S11 of the support member 151 is substantially the same as a length of a second lateral side of the substrate 111 corresponding to the second lateral side of the support member 151. In addition, the lengths D1 and D2 of the first and second lateral sides of the support member 151 may be longer or shorter than the lengths of the first and second lateral sides of the substrate 111, but the embodiment is not limited thereto. Further, a distance D5 between the first and second connection electrodes 141 and 143 is an interval between two adjacent electrode pads and corresponds to ½ or more with respect to the length of one lateral side of the light emitting device. The bottom surface of the support member 151 is a substantially flat surface or an irregular surface, but the embodiment is not limited thereto.

A thickness T1 of the first region of the support member 151 is at least thicker than a thickness H2 of the second connection electrode 143. Alternatively, the thickness T1 of the first region of the support member 151 may be thinner than the thickness H2 of the second connection electrode 143. If the thickness of the insulating layer 133 is thicker than the thickness of the second connection electrode 143, the thickness of the support member 151 may become thin. In addition, a thickness T2 of the second region of the support member 151 may be thicker than a thickness of the first connection electrode 141. The thickness T1 of the support member 151 may be in the range of 1 μm~100,000 μm or 50 μm~1,000 μm. The thickness T1 of the support member 151 may be thicker than the thickness of the substrate 111, but the embodiment is not limited thereto.

The bottom surface of the support member 151 is lower than the bottom surfaces of the first and second electrodes 135 and 137 and is aligned on the same plane (that is, horizontal plane) with the bottom surfaces of the first and second connection electrodes 141 and 143.

The support member 151 makes contact with outer peripheral surfaces of the first and second electrodes 135 and 137 and first and second connection electrodes 141 and 143. Thus, heat induced from the first and second electrodes 135 and 137 and first and second connection electrodes 141 and 143 can be diffused and dissipated through the support member 151. The thermal conductivity of the support member 151 can be improved by the thermal diffusion agent contained in the support member 151, so that the support member 151 can dissipate the heat through the whole surface of the support member 151. Thus, the reliability of the light emitting device 100 can be improved against heat.

In addition, one lateral side S11 of the support member 151 can be aligned on the same plane (that is, vertical plane) with the lateral sides of the light emitting structure 120 and the substrate 111. Further, one or at least one lateral side of the support member 151 may protrude beyond the light emitting structure 120 and the lateral side S2 of the substrate 111, but the embodiment is not limited thereto.

The light emitting device 100 is mounted through the flip scheme, so the most of light is emitted toward the top surface S1 of the substrate 111 and some light is emitted through the lateral sides of the substrate 111 and the light emitting structure 120. Thus, the light loss caused by the first and second electrodes 135 and 137 can be reduced.

Figure 4:
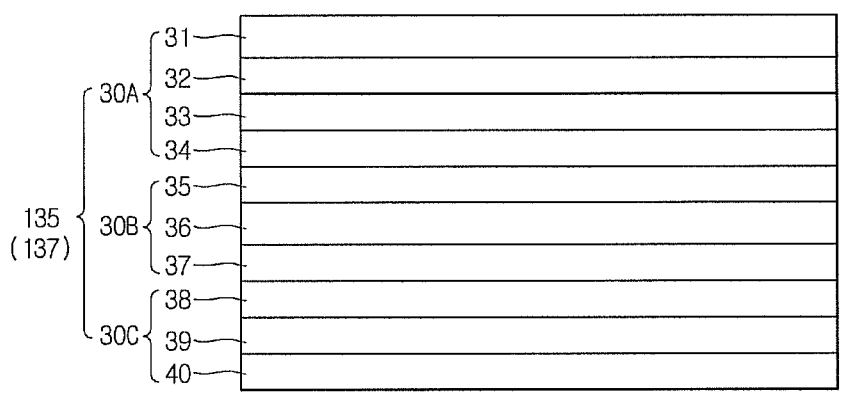
FIG. 4 is a view showing the detailed structure of first and second electrodes of FIG. 1.

FIG. 4 is a view showing the detailed structure of first and second electrodes of FIG. 2.

Referring to FIG. 4, at least one of the first and second electrodes 135 and 137 includes an electrode pad 30A, a first bonding electrode 30B under the electrode pad 30A, and a second bonding electrode 30C under the first bonding electrode 30B. The electrode pad 30A of the first electrode 135 may physically make contact with the first conductive semiconductor layer 115 and the electrode pad 30A of the second electrode 137 may physically make contact with the reflective electrode layer 131. The first bonding electrode 30B is aligned between the electrode pad 30A and the second bonding electrode 30C to bond the electrode pad 30A with the second bonding electrode 30C, and the second bonding electrode 30C is aligned between the first bonding electrode 30B and the connection electrodes 141 and 143 to bond the first bonding electrode 30B with the connection electrodes 141 and 143. The electrode pad 30A, the first bonding electrode 30B and the second bonding electrode 30C may have the same width or at least one of the electrode pad 30A, the first bonding electrode 30B and the second bonding electrode 30C may have the width different from the width of the others, but the embodiment is not limited thereto.

The electrode pad 30A includes an adhesive layer 31, a reflective layer 32 under the adhesive layer 31, a diffusion barrier layer 33 under the reflective layer 32 and a bonding layer 34 under the diffusion barrier layer 33. The adhesive layer 31 is bonded to the lower portion of the reflective electrode layer 130 or the first conductive semiconductor layer 115 and includes one selected from the group consisting of Cr, Ti, Co, Ni, V, Hf and an alloy thereof. The adhesive layer 31 has a thickness of about 1 Å to 1,000 Å. The reflective layer 32 is formed under the adhesive layer 31 and includes one selected from the group consisting of Ag, Al, Ru, Rh, Pt, Pd and an alloy thereof. The reflective layer 31 has a thickness of about 1 Å to 10,000 Å. The diffusion barrier layer 33 is formed under the reflective layer 32 and includes one selected from the group consisting of Ni, Mo, W, Ru, Pt, Pd, La, Ta, Ti and an alloy thereof. The diffusion barrier layer 33 has a thickness of about 1 Å to 10,000 Å. The bonding layer 34 includes one selected from the group consisting of Al, Au, Cu, Hf, Pd, Ru, Rh, Pt and an alloy thereof. The bonding layer 34 has a thickness of about 1 Å to 10,000 Å. The electrode pad 30A may not include the reflective layer 32.

The first bonding electrode 30B may include at least three metal layers. The first bonding electrode 30B includes an adhesive layer 35, a support layer 36 under the adhesive layer 35, and a protective layer 37 under the support layer 36. The adhesive layer 35 is bonded to the electrode pad 30A and includes one selected from the group consisting of Cr, Ti, Co, Cu, Ni, V, Hf and an alloy including at least two of the above elements. The adhesive layer 35 has a thickness of about 1 Å to 10,000 Å. The support layer 36 is thicker than the adhesive layer 35 and includes one selected from the group consisting of Ag, Al, Au, Co, Cu, Hf, Mo, Ni, Ru, Rh, Pt, Pd and an alloy including at least two of the above elements. The support layer 36 has a thickness of about 1 Å to 500,000 Å or 1,000 Å to 10,000 Å. The protective layer 37 protects the semiconductor layer from external impact and includes one selected from the group consisting of Au, Cu, Ni, Hf, Mo, V, W, Rh, Ru, Pt, Pd, La, Ta, Ti and an alloy including at least two of the above elements. The protective layer 37 has a thickness of about 1 Å to 50,000 Å.

In addition, the adhesive layer 35 and the support layer 36 of the first bonding electrode 30B may be repeatedly laminated with at least one periodicity.

The second bonding electrode 30C includes at least three metal layers. In detail, the second bonding electrode 30C includes an adhesive layer 38, a diffusion barrier layer 39 under the adhesive layer 38, and a bonding layer 40 under the diffusion barrier layer 39. The adhesive layer 38 is bonded to the first bonding electrode 30B and includes one selected from the group consisting of Cr, Ti, Co, Ni, V, Hf and an alloy including at least two of the above elements. The adhesive layer 38 has a thickness of 1 Å to 1,000 Å. The diffusion barrier layer 39 prevents the interlayer diffusion and includes one selected from the group consisting of Ni, Mo, Hf, W, Ru, Pt, Pd, La, Ta, Ti and an alloy including at least two of the above elements. The diffusion barrier layer 39 has a thickness of 1 Å to 10,000 Å. The bonding layer 40 is bonded to the connection electrodes 141 and 143 and includes one selected from the group consisting of Au, Cu, Ni, Hf, Mo, V, W, Rh, Ru, Pt, Pd, La, Ta, Ti and an alloy including at least two of the above elements. The bonding layer 40 has a thickness of 1 Å to 10,000 Å. The adhesive layer 38 and the diffusion barrier layer 39 of the second bonding electrode 30C may be repeatedly laminated with at least one periodicity. In the first and second electrodes 135 and 137, the electrode pad 30A, the first bonding electrode 30B and the second bonding electrode 30C may have the same stack structure or mutually different stack structures, and the embodiment is not limited thereto.

Figure 5:
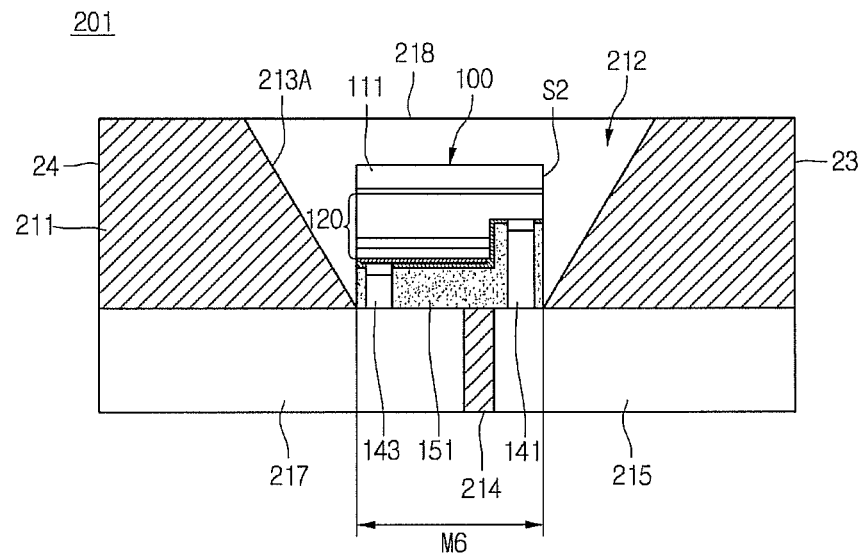
FIG. 5 is a side sectional view showing a light emitting device package according to the second embodiment.

FIG. 5 is a side sectional view showing a light emitting device package according to the second embodiment. In the following description of the second embodiment, refer to the first embodiment for the parts the same as those of the first embodiment.

Referring to FIG. 5, the light emitting device package 201 includes a body 211 having a cavity 212, first and second lead electrodes 215 and 217 at least a part of which is disposed in the cavity 212 of the body 211, a molding member 218 and a light emitting device 100.

The cavity 212 may have a concave structure having a predetermined depth from the top surface of the body 211 and may have a shape in which a lower width M6 is narrow and an upper width is wide. A sidewall 213A of the cavity 212 may be inclined with respect to the bottom of the cavity 212 or the bottom surface of the support member 151 of the light emitting device 100. The inclination angle of the sidewall 213A of the cavity 212 is in the range of 5° to 90° with respect to the bottom of the cavity 212 or the bottom surface of the support member 151 of the light emitting device 100. The cavity 212 may be configured in a line symmetric structure about the center line thereof.

The bottom width M6 of the cavity 212 may be equal to the bottom width of the light emitting device 100, for instance, the width D1 of FIG. 3, or may be larger than the bottom width of the light emitting device 100 by the range of 0.1 μm to 100 μm. In addition, the lower width of the cavity 212 may be equal to the upper width of the cavity 212 and the sidewall 213A of the cavity 212 may be vertical to the bottom of the cavity 212 or the bottom surface of the support member 151 of the light emitting device 100. The sidewall 213A of the cavity 212 may be spaced apart from the lateral side S2 of the light emitting device 100 by 100 μm or less, for instance, in the range of 0.1 μm to 100 μm.

In addition, since the bottom area of the cavity 212 has a size corresponding to the bottom width of the light emitting device 100, the light emitting device 100 can be more easily mounted. Further, since the cavity 212 is disposed closer to the lateral side S2 of the light emitting device 100, the light extraction efficiency can be improved due to the inclined sidewall 213A of the cavity 212. In addition, since the bottom area of the cavity 212 is small, the light emitted from the light emitting device may not travel to the bottom of the cavity 212, so that the light loss can be reduced.

Figure 6:
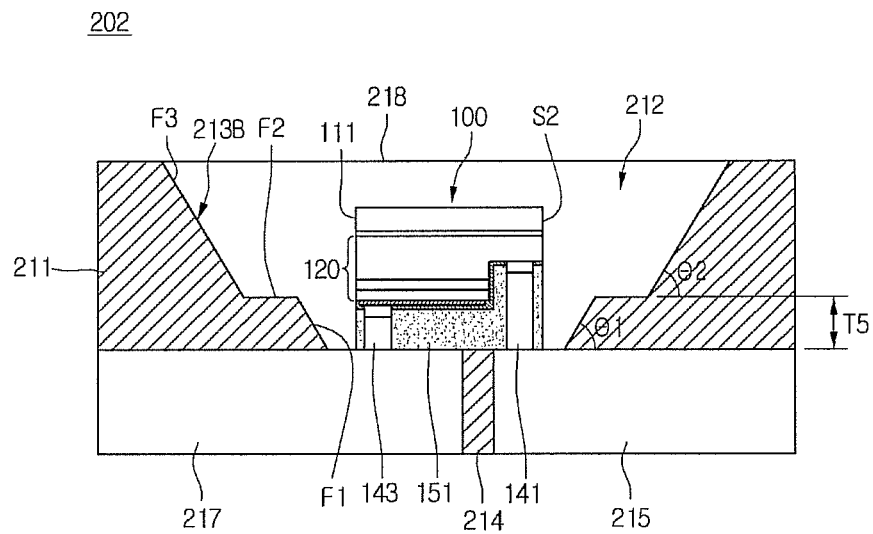
FIG. 6 is a side sectional view showing a light emitting device package according to the third embodiment.

FIG. 6 is a side sectional view showing a light emitting device package according to the third embodiment. In the following description of the third embodiment, refer to the first embodiment for the parts the same as those of the first embodiment.

Referring to FIG. 6, the light emitting device package 202 includes a body 211 having a cavity 212, first and second lead electrodes 215 and 217 at least a part of which is disposed in the cavity 212 of the body 211, a molding member 218 and a light emitting device 100.

The light emitting device 100 is flip-bonded onto the first and second lead electrodes 215 and 217 disposed on the bottom of the cavity 212. The sidewall 213B of the cavity 212 includes a first reflective portion F1, a second reflective portion F2 and a third reflective portion F3. The first reflective portion F1 is disposed around a lower portion of the cavity 100 and closer to the light emitting device 100 as compared with the third reflective portion F3. The first reflective portion F1 is inclined or vertical to the bottom of the cavity 212 or the bottom surface of the support member 151 of the light emitting device 100. An interval M5 between the first reflective portion F1 and the lateral side of the light emitting device 100 is 100 μm or less, for instance, in the range of 0.01 μm to 100 μm. A thickness T5 of the first reflective portion F1 may be equal to or different from a thickness of the support member 151 of the light emitting device 100 and may be thinner than a thickness (for instance, vertical thickness) of the third reflective portion F3. The thickness T5 of the first reflective portion F1 may be in the range of 1 μm to 100,000 μm., for instance, in the range of 50 μm to 1,000 μm.

The first reflective portion F1 and the third reflective portion F3 may be discontinuously formed. The first reflective portion F1 is located corresponding to the support member 151 under the reflective electrode layer 131 and the third reflective portion F3 is located corresponding to the light emitting structure 120 and the substrate 111 to effectively reflect the light leaked out of the reflective electrode layer 131.

The second reflective portion F2 is disposed between the first and third reflective portions F1 and F3 and parallel to the bottom of the cavity 212 or the bottom surface of the support member 151 of the light emitting device 100. The first reflective portion F1 and the second reflective portion F2 may form a stepped structure and the second reflective portion F2 and the third reflective portion F3 may form a stepped structure. The first reflective portion F1 and the third reflective portion F3 are inclined surfaces and the second reflective portion F2 is a horizontal plane or an inclined surface having an inclination angle different from the inclination angle of the first reflective portion F1 and the third reflective portion F3, but the embodiment is not limited thereto.

A first angle θ1 of the first reflective portion F1 and a second angle θ2 of the third reflective portion F3 may be equal to or different from each other within the range of 10° to 90°. For instance, the first angle θ1 of the first reflective portion F1 is 60° or less to effectively reflect the light emitting from the lateral side S2 of the light emitting structure 120 of the light emitting device 100, but the embodiment is not limited thereto.

The second angle θ2 of the third reflective portion F3 is 45° or above. An interval between the third reflective portion F3 and the light emitting device 100 is larger than an interval between the first reflective portion F1 and the light emitting device 100. That is, the third reflective portion F3 is inclined at an angle of 45° or above to uniformly distribute the light emitted from the light emitting device 100.

Figure 7:
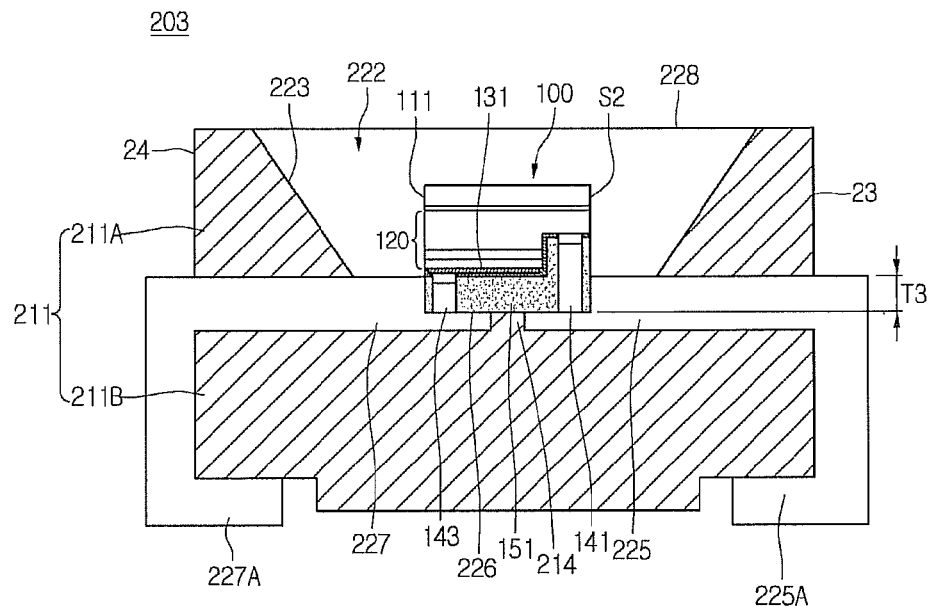
FIG. 7 is a side sectional view showing a light emitting device package according to the fourth embodiment.

FIG. 7 is a side sectional view showing a light emitting device package according to the fourth embodiment. In the following description of the fourth embodiment, refer to the first embodiment for the parts the same as those of the first embodiment.

Referring to FIG. 7, the light emitting device package 203 includes a body 221 having a cavity 222, first and second lead electrodes 225 and 227 at least a part of which is disposed in the cavity 222 of the body 221, a molding member 228 and a light emitting device 100.

The body 221 includes a support portion 221B and a reflective portion 221A. The reflective portion 221A may be formed of the same material of the support portion 221B or a resin material having high reflectivity, but the embodiment is not limited thereto. The reflective portion 221A may be formed of silicon or epoxy material having high transmittance and low reflectivity.

The first lead electrode 225 protrudes toward the first lateral side 23 of the body 221 from the bottom of the cavity 222 and the second lead electrode 227 protrudes toward the second lateral side 24 of the body 221 from the bottom of the cavity 222 between the support portion 221B and the reflective portion 221A.

A first terminal 225A connected to the first lead electrode 225 is disposed at a region adjacent to the first lateral side 23 and a second terminal 227A connected to the second lead electrode 227 is disposed at a region adjacent to the second lateral side 24 in the lower portion of the body 221.

A recess 226 is formed at the bottom of the cavity 222. The recess 226 may have a depth T3 shallower than the distance between the top surface of the first and second lead electrodes 225 and 227 and the bottom of the cavity 222. The depth T3 of the recess 226 is smaller than the thickness of the first and second lead electrodes 225 and 227 and defined in the first lead electrode, a gap portion 224 and the second lead electrode 227 and the light emitting device 100 is flip-bonded onto the top surfaces of the first and second lead electrodes 225 and 227 disposed in the recess 226.

The depth T3 of the recess 226 is sufficient for receiving at least a part of the light emitting device 100. For instance, at least a part of the support member 151 of the light emitting device 100 may be inserted into the recess 226 having the depth T3. The depth T3 of the recess 226 is in the range of 1 μm to 100,000 μm, for instance, 50 μm to 1,000 μm.

Since the recess 226 is formed at the bottom of the cavity 222 and the lower portion of the light emitting device 100 is inserted into the recess 226, the reflective electrode layer 131 of the light emitting device 100 may be aligned substantially on the same horizontal plane with the top surfaces of the first and second lead electrodes 225 and 227. In addition, the depth T3 of the recess 226 may be equal to or larger than the thickness of the support member 151.

Therefore, the light emitted from the light emitting device 10 may be reflected from the reflective electrode layer 131, the first and second lead electrodes 225 and 227 and the sidewall 223 of the cavity 222, so that the light extraction efficiency can be improved.

Figure 8:
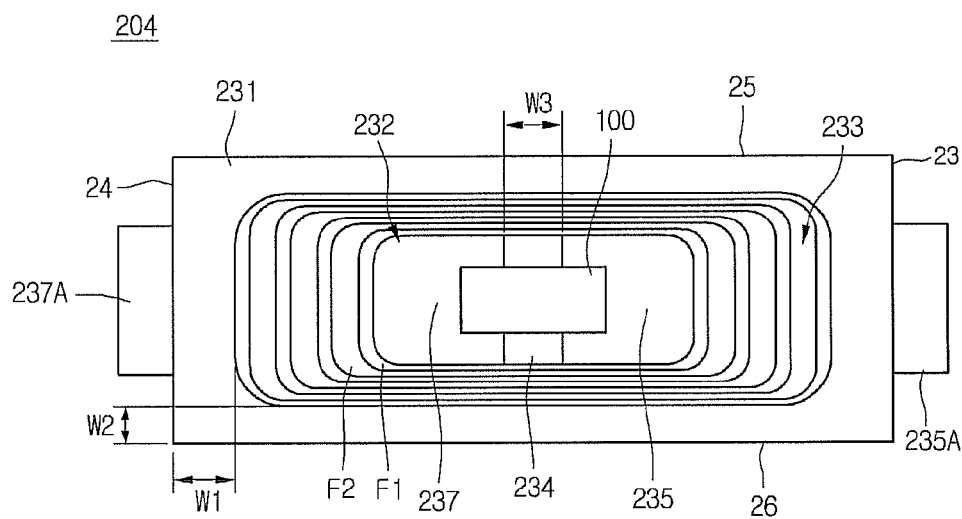
FIG. 8 is a side sectional view showing a light emitting device package according to the fifth embodiment.
Figure 9:
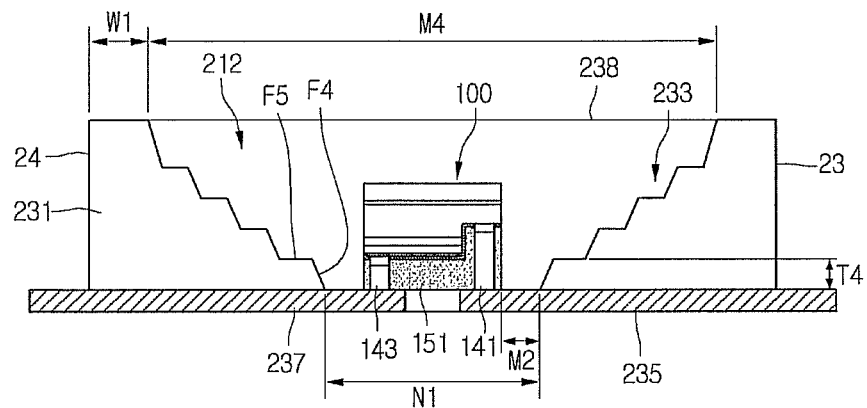
FIG. 9 is a side sectional view of a light emitting device package shown in FIG. 8.

FIG. 8 is a side sectional view showing a light emitting device package according to the fifth embodiment and FIG. 9 is a side sectional view of a light emitting device package shown in FIG. 8. In the following description of the fifth embodiment, refer to the first embodiment for the parts the same as those of the first embodiment.

Referring to FIGS. 8 and 9, the light emitting device package 204 includes a body 231 having a cavity 232, first and second lead electrodes 235 and 237 at least a part of which is disposed in the cavity 232 of the body 231, a molding member 238 and a light emitting device 100.

An upper width M4 of the cavity 232 may be wider than a lower width of the cavity 232. In detail, the cavity 232 may be gradually widened from the lower portion to the upper portion thereof. The sidewall 233 of the cavity 232 includes a plurality of first inclined reflective portions F4 and second reflective portions F5 for connecting the first inclined reflective portions F4. An interval N1 between two first reflective portions F4 corresponding to each other in the cavity 232 may become widened in the upward direction of the cavity 232.

The first reflective portions F4 are inclined at a third angle θ3 with respect to the bottom of the cavity 232. The third angle θ3 is in the range of 5° to 90°, for instance, in the range of 20° to 70°. The first reflective portions F4 may be inclined at the same angle or at the mutually different angles. In addition, the first reflective portions F4 may be configured such that the third angle θ3 may be gradually increased or reduced in the upward direction of the cavity 232. A thickness T4 of the first reflective portion F4 may be thinner the thickness of the support member 151. For instance, the thickness T4 of the first reflective portion F4 is in the range of 1 μm to 100,000 μm, or 50 μm to 1,000 μm.

The first reflective portions F4 may be continuously or discontinuously disposed along the peripheral surface of the cavity 232. For instance, the first reflective portions F4 may be disposed on two opposite lateral sides of the cavity 232 without being disposed on remaining two opposite lateral sides of the cavity 232. The second reflective portions F5 may be configured as flat surfaces parallel to each other or inclined surfaces having the inclination angle different from that of the first reflective portions F4.

A first terminal 235A of the first lead electrode 235 protrudes outward beyond the first lateral side 23 of the body 231 and a second terminal 237A of the second lead electrode 237 protrudes outward beyond the second lateral side 24 of the body 231.

In the top surface of the body 231, an interval between the first and second lateral sides 23 and 24 may be equal to or larger than an interval between third and fourth lateral sides 25 and 26. For instance, the interval between the first and second lateral sides 23 and 24 may be in the range of 1 mm to 100 mm, for instance, in the range of 2.5 mm to 9 mm. In addition, the interval between the third and fourth lateral sides 25 and 26 may be in the range of 1 mm to 100 mm, for instance, in the range of 2.5 mm to 9 mm.

In the top surface of the body 231, an interval W1 between cavity 232 and the second lateral side 23 may be in the range of 0.1 mm to 50 mm, for instance, in the range of 0.35 mm to 1 mm. In the top surface of the body 231, an interval between cavity 232 and the fourth lateral side 26 may be in the range of 0.1 mm to 50 mm, for instance, in the range of 0.35 mm to 1 mm. The body 251 may have a thickness in range of 0.3 mm to 100 mm, for instance, in the range of 0.5 mm to 2 mm.

A gap portion 234 between the first and second lead electrodes 235 and 237 may include a material the same as that of the body 231 or an insulating material. A width W3 of the gap portion 234 may be narrower than an interval between adjacent connection electrodes 141 and 143. The width W3 of the gap portion 234 may be in the range of 0.01 mm to 10 mm, for instance, in the range of 0.1 mm to 2 mm.

The first and second lead electrodes 235 and 237 may have the thickness in the range of 0.1 to 1,000 mm, for instance, 0.1 mm to 0.5 mm.

Figure 10:
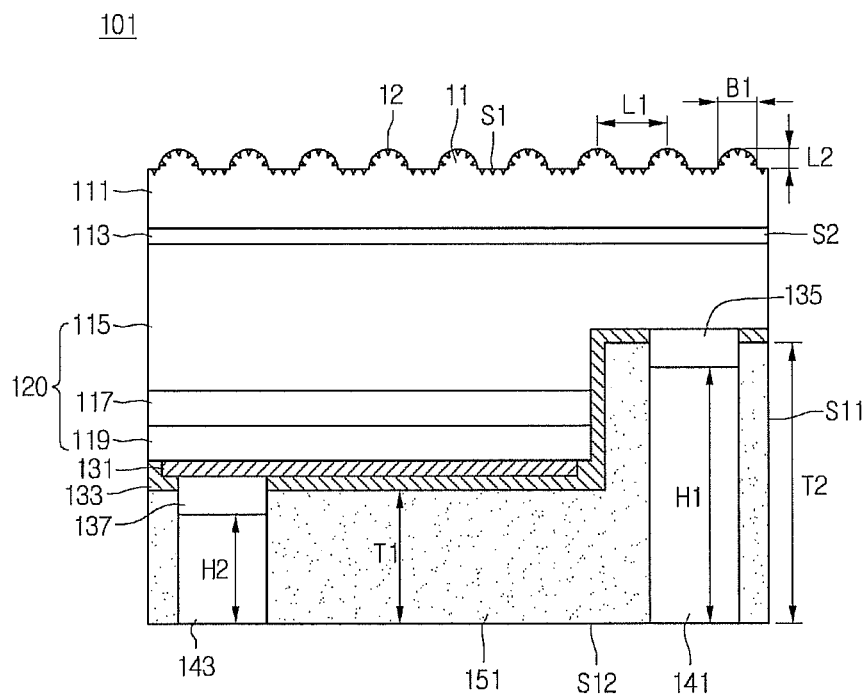
FIG. 10 is a view showing a first modified example of a light emitting device shown in FIG. 1.

FIG. 10 is a view showing a first modified example of the light emitting device shown in FIG. 2. Hereinafter, in the following description of FIG. 10, the same parts as those of the FIG. 2 will make a reference to the FIG. 2.

Referring to FIG. 10, the light emitting device 101 includes a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143 and a support member 151.

At least one of first and second pattern sections 11 and 12 may be disposed on the substrate 111. The first pattern section 11 is configured as a first concavo-convex structure having a plurality of protrusions protruding from the top surface S1 of the substrate 111 and the second pattern section 12 is configured as a second concavo-convex structure having a plurality of recesses in the first concavo-convex structure. The second concavo-convex structure is disposed on the first concavo-convex structure and defined by a micro concavo-convex configuration having a size smaller than a size of the protrusions.

The protrusions of the first pattern section 11 may protrude from the top surface S1 of the substrate 111 or may have an embossing shape. According to another example, the first pattern section 11 may be recessed or engraved with a small depth lower than the top surface of the substrate 111. The concaves of the second pattern section 12 may be disposed on the surface of the first pattern section 11 in an intaglio shape or a recess shape with a size smaller than a size of the protrusions of the first pattern section 11. According to another example, the second pattern section 12 may have an embossing shape or a convex shape and may be disposed with micro protrusions having a size smaller than that of the protrusions of the first pattern section 11. The first pattern section 11 may be aligned in the form of a matrix or a lattice. The protrusions of the first pattern section 11 may have a side sectional shape of a hemisphere, a cone, a polygonal cone, a column, such as a cylinder or a polygonal column, or a truncated cone. When viewed from the top, each protrusion may have a circular shape, a polygonal shape, or a mixed shape of a sphere and a planar surface.

The concaves of the second pattern section 12 may have a side sectional shape of a hemisphere, a cone, a polygonal cone, a column, such as a cylinder or a polygonal column, or a truncated cone. When viewed from the top, the second pattern section 12 may have a circular shape, a polygonal shape, or a mixed shape of a sphere and a planar surface.

The protrusion of the first pattern section 11 may have a width B1 in the range of 0.1 μm to 10 μm. For instance, the width B1 is smaller than the thickness of the substrate 111. The width of the protrusion may be larger than the thickness L1 or the height of the protrusion, but the embodiment is not limited thereto. The depth or width of the concave of the second pattern section 12 is in the range of 0.1 nm to 100 nm or in the range of 0.1 nm to 100 μm. A period L1 between the protrusions of the first pattern section 11 may be in the range of 0.1 μm to 100 μm and a period between the concaves of the second pattern section 12 may be in the range of 0.1 μm to 100 μm.

The first and second pattern sections 11 and 12 change the critical angle of the incident light to reduce the ratio of the total reflection of the light, thereby improving the light extraction efficiency. Thus, if the light emitting device is disposed in the cavity of the light emitting device package shown in FIG. 1, the light extraction efficiency can be more improved.

A luminescence layer may be disposed on the substrate 111. The luminescence layer may make contact with the first and second pattern sections 11 and 12 of the substrate 111 or may be spaced part from the first and second pattern sections 11 and 12 of the substrate 111, and the embodiment is not limited thereto.

Figure 11:
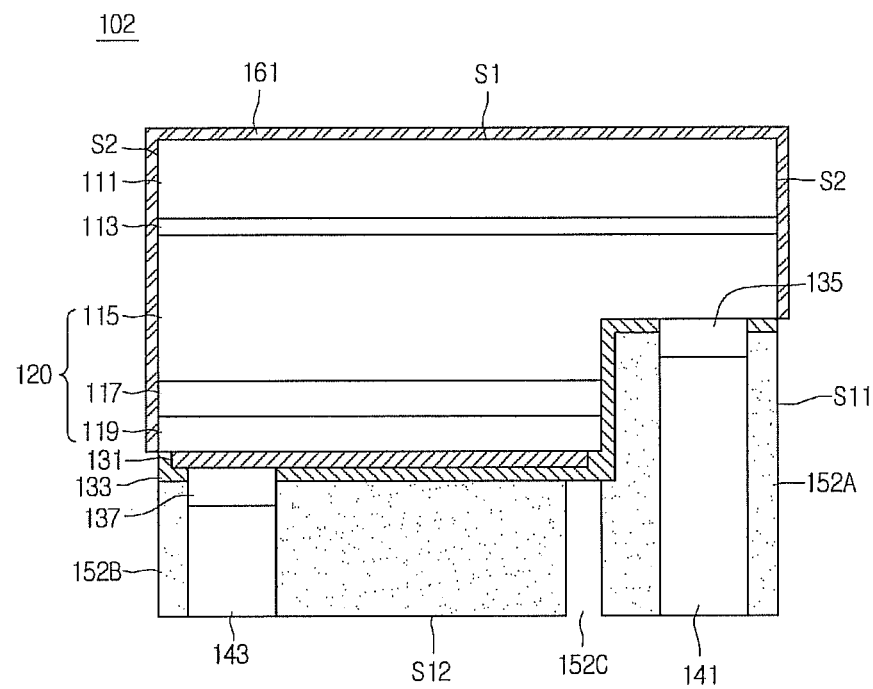
FIG. 11 is a view showing a second modified example of a light emitting device shown in FIG. 1.

FIG. 11 is a view showing a second modified example of the light emitting device shown in FIG. 1.

Referring to FIG. 11, the light emitting device 102 includes a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, support members 152A and 152B and a phosphor layer 161.

The phosphor layer 161 is disposed on a surface of the substrate 111 in opposition to the support member 151, that is, disposed on the light exit surface. The phosphor layer 161 may include a phosphor film or a coated layer and can be prepared as a single layer or multiple layers.

The phosphor layer 161 includes a transparent resin layer containing phosphor. The transparent resin layer includes silicon or epoxy, and the phosphor includes one selected from the group consisting of YAG, TAG, silicate, nitride, and oxy-nitride-based material. The phosphor includes at least one of a red phosphor, a yellow phosphor and a green phosphor and excites a part of the light emitted from the active layer 117 to convert the wavelength of the light to be emitted.

The phosphor layer 161 is disposed on a top surface S1 of the substrate 111 and at least one lateral side S2 of the substrate 111 and the light emitting structure 120. The phosphor layer 161 has the thickness in the range of 1 μm to 100,000 μm or 1 μm to 10,000 μm. The thickness of the phosphor layer 161 is the widthwise length of the light emitting structure 120.

The phosphor layer 161 may include various phosphor layers different from each other, in which a first layer is one of red, yellow and green phosphor layers, and a second layer is disposed on the first layer and different from the first layer. Two different phosphor layers can be disposed on first and second regions, which are not overlapped with each other, respectively. A protective layer including a transparent resin material can be disposed on the lateral sides of the phosphor layer 161 and the light emitting structure 120, but the embodiment is not limited thereto.

A transparent resin layer or an adhesive layer may be further disposed between the substrate 111 and the phosphor layer 161, but the embodiment is not limited thereto. Pattern sections may be disposed on upper and lower portions of the substrate 111 to improve the light extraction efficiency. If the pattern sections are disposed on the upper portion of the substrate, the phosphor layer 161 may be prepared as a concavo-convex layer, but the embodiment is not limited thereto.

In addition, a division slot 152C is disposed between support members 152A and 152B. The division slot 152C divides the support members 152A and 152B from each other. The first support member 152A is disposed under one side of the light emitting structure 120 around the first connection electrode 141. The second support member 152B is disposed under the other side of the light emitting structure 120 around the second connection electrode 143.

The division slot 152C physically and electrically separates the first support member 152A from the second support member 152B and exposes the insulating layer 133 disposed under the division slot 152C.

The first and second support members 152A and 152B may include the insulating material or the conductive material. The insulating material includes a resin material having the thermal diffusion agent. The conductive material includes carbon, SiC or a metal. If the first and second support members 152A and 152B include the conductive material, the first and second electrodes 141 and 143 include materials different from the conductive material.

Since the first and second support members 152A and 152B including the conductive material are separated from each other by the division slot 152C, the electric short can be prevented.

The division slot 152C has a width corresponding to a distance between the first and second support members 152A and 152B, and a depth corresponding to the thickness of the second support member 152B. The division slot 152C prevents the electric interference between the first and second support members 152A and 152B.

The bottom surfaces of the first and second support members 152A and 152B are aligned on the same plane with the bottom surfaces of the first and second connection electrodes 141 and 143. The first and second support members 152A and 152B can be mounted through the first and second connection electrodes 141 and 143 even if the first and second support members 152A and 152B include the conductive materials.

An insulating material including a ceramic material can be further disposed between first and second support members 152A and 152B. In this case, the ceramic material is aligned on the same horizontal plane with the bottom surfaces of the first and second support members 152A and 152B. The first and second support members 152A and 152B may be applied to the structure shown in FIG. 2 or other embodiments without limitation.

Figure 12:
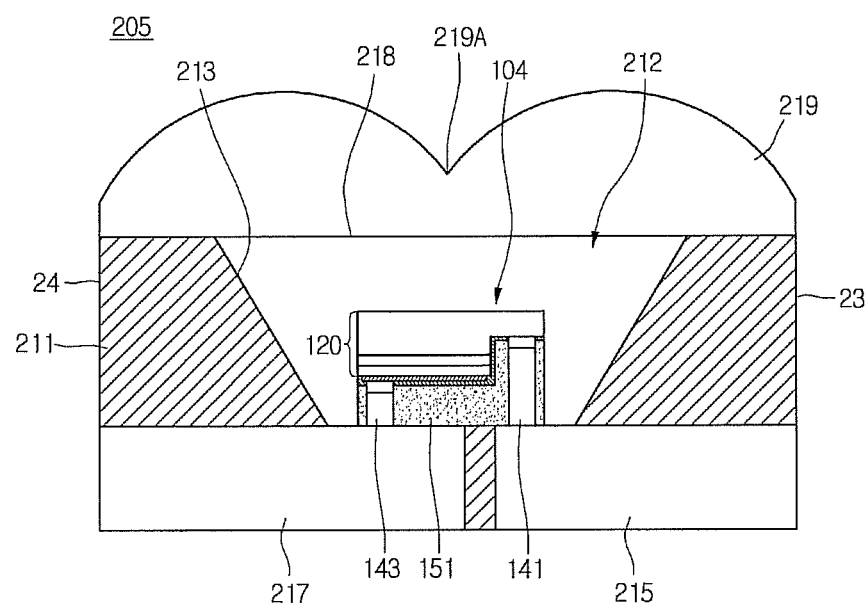
FIG. 12 is a side sectional view showing a light emitting device package according to the sixth embodiment.

FIG. 12 is a side sectional view showing a light emitting device package according to the sixth embodiment. In the following description of the sixth embodiment, refer to the first embodiment for the parts the same as those of the first embodiment.

Referring to FIG. 12, the light emitting device package 205 includes a body 211 having a cavity 212, first and second lead electrodes 215 and 217 at least a part of which is disposed in the cavity 212 of the body 211, a molding member 218, an optical lens 129 and a light emitting device 104.

The semiconductor layer, for instance, the first conductive semiconductor layer, other than the substrate, may be disposed at the uppermost layer of the light emitting device 104. A rough structure, such as a light extraction structure, may be disposed on the top surface of the semiconductor layer.

The optical lens 219 is disposed on the body 211. The optical lens 219 may include a resin material, such as a transparent resin including silicon or epoxy, or a glass material. The optical lens 219 is disposed with a recess 219A at a region corresponding to the light emitting device 104 in order to improve the orientation angle of the light and the recess 219A is recessed toward the light emitting device 104. The recess 219A may be an angular surface inclined with respect to an optical axis of the light emitting device 104 or a curved surface and may include a total reflective surface or a reflective surface.

Figure 13:
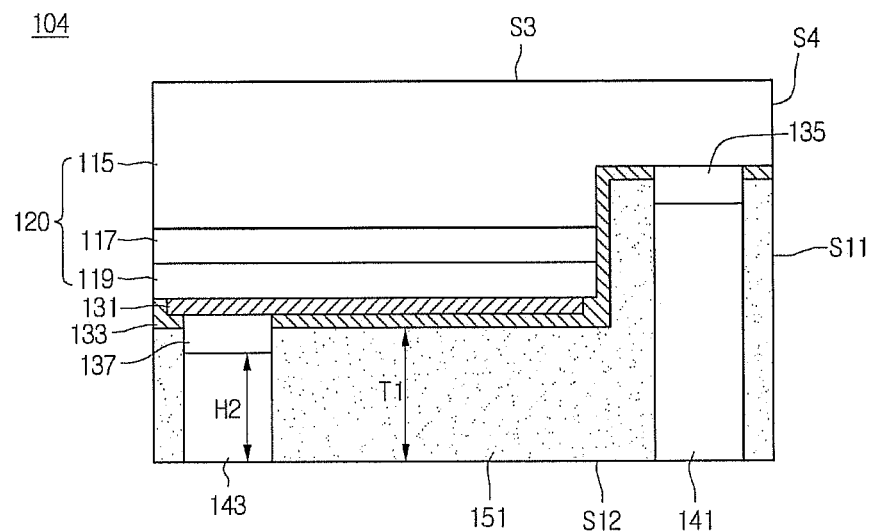
FIG. 13 is a view showing a light emitting device of a light emitting device package shown in FIG. 12.

FIG. 13 is a view showing the light emitting device of the light emitting device package shown in FIG. 12.

Referring to FIG. 13, the light emitting device 104 includes a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, and a support member 151.

The substrate is removed from the light emitting device 104 and the first conductive semiconductor layer 115 is disposed on the light exit region. A pattern section, such as a light extraction structure or a concavo-convex structure, may be disposed on the top surface S3 of the first conductive semiconductor layer 115. The pattern section may be disposed by etching an upper portion of the first conductive semiconductor layer 115, but the embodiment is not limited thereto.

A lateral side S4 of the light emitting structure 120 may be aligned on the same plane with a lateral side S11 of the support member 151 or may be aligned vertically to a bottom surface S12 of the support member 151, but the embodiment is not limited thereto.

In addition, the phosphor material is added to the molding member 218 or the phosphor layer disposed on the light emitting device 104, but the embodiment is not limited thereto.

Figure 14:
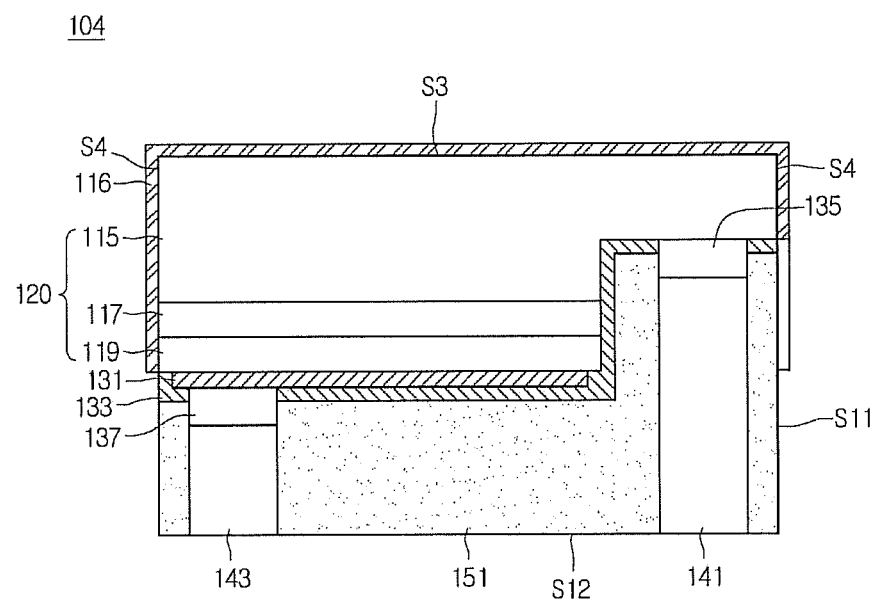
FIG. 14 is a view showing a first modified example of a light emitting device shown in FIG. 12.

FIG. 14 is a view showing a first modified example of the light emitting device shown in FIG. 12.

Referring to FIG. 14, the light emitting device 104 includes a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, a support member 151, and a phosphor layer 162.

The phosphor layer 162 may be disposed on at least one of a top surface S3 and a lateral side S4 of the light emitting structure 120. For instance, the phosphor layer 162 may be disposed on the top surface S3 and the lateral side S4 of the light emitting structure 120, but the embodiment is not limited thereto. The phosphor layer 162 includes a transparent resin layer containing phosphor materials. The transparent resin layer includes silicon or epoxy, and the phosphor material includes one selected from the group consisting of YAG, TAG, silicate, nitride, and oxy-nitride-based material. The phosphor material includes at least one of a red phosphor material, a yellow phosphor material and a green phosphor material and excites a part of the light emitted from the active layer 117 to convert the wavelength of the light to be emitted.

The phosphor layer 162 has the thickness in the range of 1 μm to 100,000 μm, for instance, 1 μm to 10,000 μm. The thickness of the phosphor layer 162 is the widthwise length of the light emitting structure 120.

The phosphor layer 162 may include various phosphor layers different from each other, in which a first layer is one of red, yellow and green phosphor layers, and a second layer is disposed on the first layer and different from the first layer. Two different phosphor layers can be disposed on first and second regions, which are not overlapped with each other, respectively. A protective layer including a transparent resin material can be disposed on the lateral sides of the phosphor layer 162 and the light emitting structure, but the embodiment is not limited thereto.

Figure 15:
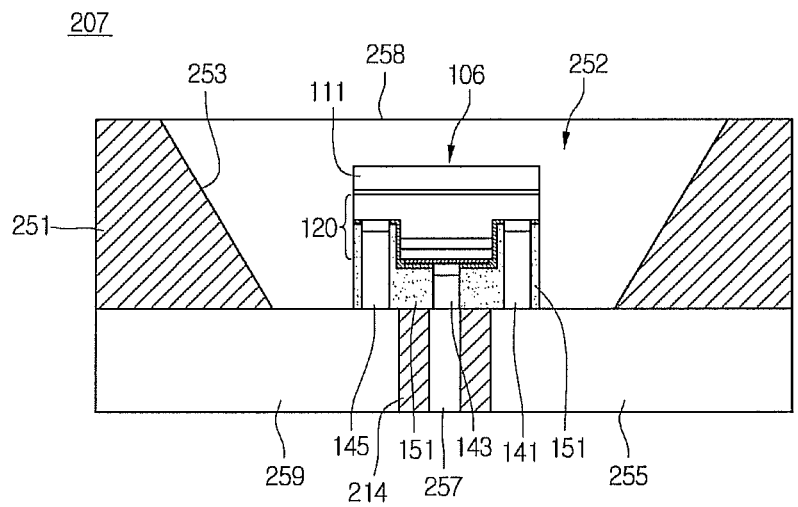
FIG. 15 is a side sectional view showing a light emitting device package having a light emitting device according to the seventh embodiment.

FIG. 15 is a side sectional view showing a light emitting device package having a light emitting device according to the seventh embodiment.

Referring to FIG. 15, the light emitting device package 207 includes a body 251 having a cavity 252, first to third lead electrodes 255, 257 and 259 at least a part of which is disposed in the cavity 252, and at least one light emitting device 106. Refer to the description according to the first embodiment for the body 251 and the cavity of the body 251. For instance, the body 251 is injection molded by selectively using one of a high reflective resin (for instance, PPA), a polymeric material, a plastic material or a resin material, such as silicon or epoxy, and can be prepared as a substrate having a single layer or a multiple layers. The body 251 may be disposed of a material having reflectivity of 90% or more or transmittance of 50% or more for the light emitted from the light emitting device 106.

The cavity 252 of the body 251 is a light exit region and a top surface of the cavity 252 is open. A sidewall 253 of the cavity 252 is inclined or vertical to a bottom surface of the cavity 252. The sidewall 253 of the cavity 252 may be closer to the support member 151 than to the substrate 111 of the light emitting device 106.

At least a part of the first to third lead electrodes 255, 257 and 259 is disposed in the cavity 252. Gap portions 214 are disposed among the first to third lead electrodes 255, 257 and 259. The gap portions 214 may be disposed of a material the same as that of the body 251 or other insulating materials.

The first to third lead electrodes 255, 257 and 259 may include a metallic material including at least one of Ti, Cu, Ni, Au, Cr, Ta, Pt, Sn Ag, P and Al. In addition, the first to third lead electrodes 255, 257 and 259 may be prepared as a lead frame having a single-layer structure or a multi-layer structure, but the embodiment is not limited thereto. The first to third lead electrodes 255, 257 and 259 may have a thickness in the range of 0.8 mm to 3 mm, but the embodiment is not limited thereto.

The bottom surfaces of the first to third lead electrodes 255, 257 and 259 disposed on the bottom of the cavity 252 may be aligned on the same plane with the bottom surface of the body 251, but the embodiment is not limited thereto. At least a part of the first to third lead electrodes 255, 257 and 259 may include a bending structure, but the embodiment is not limited thereto. A rough surface may be disposed on at least one surface of the first to third lead electrodes 255, 257 and 259 to increase a contact area between the body 251 and the gap portion 254. Thus, a light emitting device package having superior wet-resistance can be provided.

According to another embodiment, a concave portion is disposed at the bottom of the cavity 252 and the first to third lead electrodes 255, 257 and 259 are disposed in the concave portion. Lower electrodes of the light emitting device 106 may be electrically connected to each other in the concave portion. The concave portion may have a depth lower than a distance between a bottom surface of the support member 151 of the light emitting device 106 and an active layer and higher than a distance between a top surface of the support member 151 and the active layer.

The first and third lead electrodes 255 and 259 are connected with each other at an inside or an outside of the body 251.

The light emitting device 106 is bonded onto the first to third lead electrodes 255, 257 and 259 through the flip scheme. In detail, a first connection electrode 141 of the light emitting device 106 is bonded onto the first lead electrode 255, a second connection electrode 143 of the light emitting device 106 is bonded onto the second lead electrode 257, and a third connection electrode 145 of the light emitting device 106 is bonded onto the third lead electrode 259. Each of the first to third connection electrodes 141 to 145 are bonded to each of the first to third lead electrodes 255 to 259 through direct bonding, such as eutectic bonding, or through a bonding member, such as a solder.

The first connection electrode 141 of the light emitting device 106 may be bonded onto the third lead electrode 259 and the third connection electrode 145 of the light emitting device 106 may be bonded onto the first lead electrode 255. That is, since the first and third connection electrodes 141 and 145 are connected to the same semiconductor layer in the light emitting device 106, there is no change in electric polarity even if the position of the first and third connection electrodes 141 and 145 is interchanged when they are connected to the first and third lead electrode 255 and 259, so the light emitting device 106 can normally operate. The second connection electrode 143 supplying the power having the second polarity is disposed at the center region and the first and third connection electrodes 141 and 145 supplying the power having the first polarity are disposed at both sides of the second connection electrode 143 at the lower portion of the light emitting device 106, so the confusion for the position of the first and second polarities can be solved and the mounting failure can be prevented. That is, since the polarities of the connection electrodes 141, 143 and 145 may not be recognized to the naked eye, the connection electrode having one polarity is positioned at the center region to prevent the degradation of the product yield caused by the mounting failure of the light emitting device.

The first to third connection electrodes 141, 143 and 145 may be spaced apart from the first to third lead electrodes 255, 257 and 259 at the same interval. In addition, the bottom surface of the support member 151 of the light emitting device 106 may be spaced apart from the first to third lead electrodes 255, 257 and 259 at the same interval. Therefore, the bottom surfaces of the first to third connection electrodes 141, 143 and 145 and the support member 151 may be spaced apart from the top surfaces of the first to third lead electrodes 255, 257 and 259 at the same interval.

The support member 151 of the light emitting device 106 is bonded to the top surfaces of the first to third lead electrodes 255, 257 and 259 by an adhesive member, so thermal conduction is achieved through the first to third lead electrodes 255, 257 and 259. The adhesive member may include a thermal conductive material, such as a solder. At least one of the first to third connection electrodes 141, 143 and 145 is plural in number to increase an electric bonding area with respect to the first to third lead electrodes 255, 257 and 259 and to improve the thermal conductive efficiency.

A molding member 258 is disposed in the cavity 252. The molding member 258 includes a transparent resin material, such as silicon or epoxy. The molding member 258 may include a phosphor therein. The molding member 258 may include at least one transparent resin layer and the phosphor can make contact with the top surface of the light emitting device 106 or can be spaced apart from the top surface of the light emitting device 106. The molding member 258 may be omitted.

One or a plurality of light emitting devices can be mounted in the light emitting device package 207, but the embodiment is not limited thereto. If the light emitting device having the phosphor layer is mounted in the light emitting device package 207, the phosphor material may not be added to the molding member 258. In addition, various phosphor materials different from each other or phosphor materials emitting similar colors can be added to the molding member 258.

Figure 16:
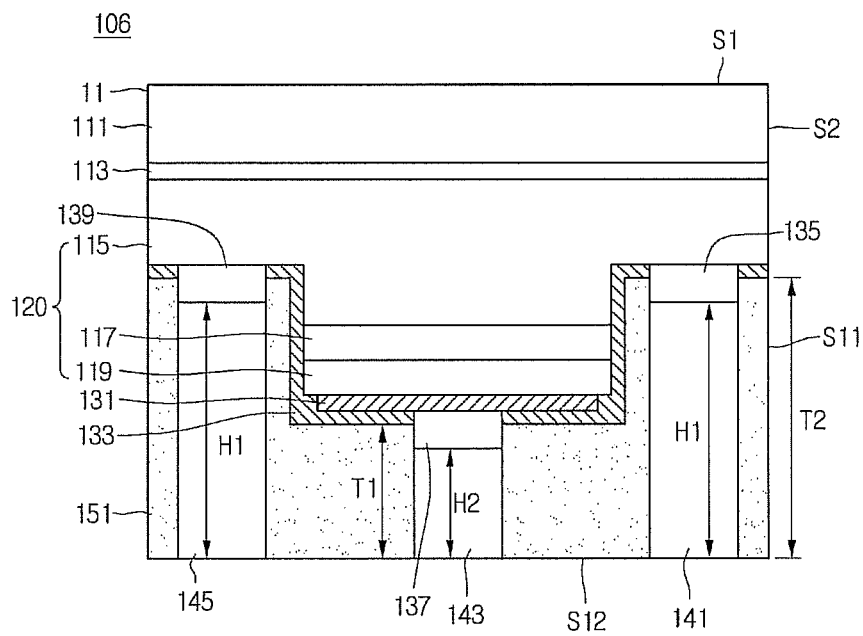
FIG. 16 is a side sectional view of a light emitting device shown in FIG. 15.

FIG. 16 is a side sectional view of the light emitting device shown in FIG. 15 and FIGS. 17 to 19 are views showing examples of first to third connection electrodes of the light emitting device shown in FIG. 16. In the following description of the light emitting device, refer to the first embodiment for the parts the same as those of the first embodiment.

Referring to FIGS. 16 to 19, the light emitting device 106 includes a substrate 111, a first semiconductor layer 113, a first conductive semiconductor layer 115, an active layer 117, a second conductive semiconductor layer 119, a reflective electrode layer 131, an insulating layer 133, first to third electrode 135, 136 and 137, first to third connection electrodes 141, 143 and 145, and a support member 151.

The substrate 111 may include a transparent substrate, an insulating substrate or a conductive substrate. For instance, the substrate 111 may include one selected from the group consisting of Al2O3, GaN, SiC, ZnO, Si, GaP, InP, Ga2O3, and GaAs.

The first semiconductor layer 113 may be disposed under the substrate 111. The first semiconductor layer 113 may be a buffer layer and/or an undoped semiconductor layer. The first semiconductor layer may be omitted or at least one of the buffer layer and the undoped semiconductor layer may be disposed, but the embodiment is not limited thereto.

A light emitting structure 120 may be disposed under the first semiconductor layer 113 or the substrate 111. The light emitting structure 120 includes the group III-V compound semiconductor. For instance, the light emitting structure 120 includes the semiconductor having the compositional formula of $In_xAl_yGa_{1-x-y}N$ ($0 \leq x \leq 1$, $0 \leq y \leq 1$, $0 \leq x+y \leq 1$) and can emit the light having a predetermined peak wavelength in the wavelength range of an ultraviolet ray band to a visible ray band.

The light emitting structure 120 includes a first conductive semiconductor layer 115, a second conductive semiconductor layer 119, and an active layer 117 between the first conductive semiconductor layer 115 and the second conductive semiconductor layer 119.

The reflective electrode layer 131 is disposed between the second conductive semiconductor layer 119 and the support member 151. The reflective electrode layer 131 includes at least one of an ohmic contact layer, a reflective layer, a diffusion barrier layer and a protective layer.

A light extracting structure, such as a roughness, can be disposed on a surface of at least one of the second conductive semiconductor layer 119 and the reflective electrode layer 131. The light extracting structure may vary the critical angle of the incident layer to improve the light extraction efficiency.

At least one first electrode 135 and at least one first connection electrode 141 are disposed in a first region A1 of the support member 151 and the at least one first electrode 135 and at least one first connection electrode 141 are closer to the lateral side S11 of the support member 151 than to the center region of the support member 151. The at least one first connection electrode 141 is connected to the at least one first electrode 135 and the at least one first electrode 135 is disposed under the first conductive semiconductor layer 115 and electrically connected to the first conductive semiconductor layer 115.

At least one third electrode 139 and at least one third connection electrode 145 are disposed in a second region A1 of the support member 151 and the at least one third electrode 139 and at least one third connection electrode 145 are closer to the lateral side S11 of the support member 151 than to the center region of the support member 151. The at least one third connection electrode 145 is connected to the at least one third electrode 139 and the at least one third electrode 139 is disposed under the first conductive semiconductor layer 115 and electrically connected to the first conductive semiconductor layer 115. The at least one first electrode 135 and the at least one third electrode 139 can make contact with mutually different regions of the first conductive semiconductor layer 115, and the embodiment is not limited thereto. In the light emitting structure 120, the first and second regions A1 and A2 may be 50% or less based on the area of the active layer 117. If the size of the first and second regions A1 and A2 exceed the above range, the light emitting area may be reduced, so that the overall brightness may be reduced. The first and second connection electrodes 141 and 145 may be opposite to each other about the center of the support member 151. The first to third connection electrodes 141, 143 and 145 may have the thickness thicker than the thickness of the first to third electrodes 135, 137 and 139.

At least one second electrode 137 and at least one second connection electrode 143 are disposed in the center region of the support member 151. The at least one second electrode 137 is disposed between the first and third electrodes 135 and 139 and the at least one second connection electrode 143 is disposed between the first and third connection electrodes 141 and 145. The first and third connection electrodes 135 and 139 are electrically insulated from the second connection electrode 137. That is, although the electrodes 135 to 139 or 141 to 145 are aligned in series in the support member 151 in the drawing, the electrodes 135 to 139 or 141 to 145 may not be aligned in series. For instance, at least one second electrode 137 or the second connection electrode 143 may deviate from other electrodes or the center line, and the embodiment is not limited thereto.

The at least one second connection electrode 143 is disposed under the at least one second electrode 137 and electrically connected to the at least one second electrode 137. The second electrode 137 is disposed under the reflective electrode layer 131 and electrically connected to the reflective electrode layer 131.

The first and third electrodes 135 and 139 are spaced apart from the active layer 117 and the lateral side of the second conductive semiconductor layer 119 and may have a size smaller than an exposed bottom surface of the first conductive semiconductor layer 115. The second electrode 137 may physically and/or electrically make contact with the second conductive semiconductor layer 119 through the reflective electrode layer 131. The first to third electrodes 135 to 139 may include electrode pads, but the embodiment is not limited thereto.

The structure of the first to third electrodes 135 to 139 has been described with reference to FIG. 4. The first to third electrodes 135 to 139 may have the same stack structure or mutually different stack structures. The stack structure of the second electrode 137 may be smaller than the stack structure of the first electrode 135 and the third electrode 139. For instance, the first and third electrodes 135 and 139 may have the stack structure of the adhesive layer/reflective layer/diffusion barrier layer/bonding layer or the adhesive layer/diffusion barrier layer/bonding layer, and the second electrode 137 may have the stack structure of the adhesive layer/reflective layer/diffusion barrier layer/bonding layer or the adhesive layer/diffusion barrier layer/bonding layer.

A top surface area of the second electrode 137 is equal to a bottom surface area of the reflective electrode layer 131 or at least larger than a top surface area of the second connection electrode 143.

At least one of the first to third electrodes 135 to 139 may include a current spreading pattern having an arm structure or a finger structure branching from the electrode pad. In addition, the first to third electrodes 135 to 139 may include one electrode pad or a plurality of electrode pads, but the embodiment is not limited thereto.

The insulating layer 133 may be disposed between the reflective electrode layer 131 and the support member 151 and between the light emitting structure 120 and the support member 151. In detail, the insulating layer 133 can be disposed on the bottom surface of the second conductive semiconductor layer 119, lateral sides of the second conductive semiconductor layer 119 and the active layer 117, and the bottom surface of the first conductive semiconductor layer 115. The insulating layer 133 is disposed on the lower region of the light emitting structure 120 except for the region for the reflective electrode layer 131, the first electrode 135 and the first to third electrodes 135 to 139 to electrically protect the lower portion of the light emitting structure 120.

The insulating layer 133 may be exposed to the lateral side of the light emitting device 106, but the embodiment is not limited thereto. The insulating layer 133 may include a partial open region and the support member 151 may be disposed through the partial open region. The support member 151 can make contact with the bottom surface of the first and second conductive semiconductor layers 115 and 119 through the open region of the insulating layer 133 or can make contact with the reflective electrode layer 131. Thus, the coupling force between the support member 151 and the insulating layer 133 can be improved. The insulating layer 133 may be disposed of a material different from a material of the support member 151 or may be omitted.

The support member 151 is used as a support layer for supporting the light emitting device 106. The support member 151 includes an insulating material, for instance, a resin layer including silicon or epoxy. The thermal diffusion agent may be added to the support member 151. The thermal diffusion agent may include at least one of oxide, nitride, fluoride and sulfide including a Al, Cr, Si, Ti, Zn or Zr. The thermal diffusion agent may be defined as a powder particle having a predetermined size, a grain, filler or an additive. In the following description, the support member 151 including the thermal diffusion agent will be described for the purpose of convenience of the explanation. The thermal diffusion agent may include an insulating material or a conductive material having a size of 1 Å to 100,000 Å. In order to improve the thermal diffusion efficiency, the thermal diffusion agent may have a size of 1,000 Å to 50,000 Å. The thermal diffusion agent includes a ceramic material. The support member 151 may be disposed of a transparent material or a non-transparent material and prepared as a single layer structure or a multi-layer structure, but the embodiment is not limited thereto. Refer to the first embodiment for the support member 151.

In addition, the amount of the thermal diffusion agent added to the support member 151 may be 1 wt % to 99 wt %. In order to improve the thermal diffusion efficiency, 50 wt % to 99 wt % of the thermal diffusion agent can be added to the support member 151. Since the thermal diffusion agent is added to the support member 151, the thermal conductivity can be more improved at the interior of the support member 151. In addition, the support member 151 has the thermal expansion coefficient of 4-11 [x106/° C.]. The above thermal expansion coefficient is equal or similar to the thermal expansion coefficient of the substrate 111, such as the sapphire substrate, so the wafer may not be warped or damaged caused by the difference in the thermal expansion coefficient between the support member 151 and the light emitting structure 120 disposed on the substrate, thereby improving the reliability of the light emitting device.

The bottom surface area of the support member 151 is substantially equal to the top surface area of the support member 151. In addition, the bottom surface area of the support member 151 is equal to the top surface area of the first conductive semiconductor layer 115. Further, the width of the bottom surface of the support member 151 may be equal to the width of the top surface of the substrate 111 and the width of the top surface of the semiconductor layer 115. Thus, since the individual chips are divided after the support member 151 has been disposed, the lateral sides of the support member 151, the substrate 111 and the first conductive semiconductor layer 115 can be aligned on the same plane.

The first to third connection electrodes 141, 143 and 145 are disposed in the support member 151 and exposed to the lower portion of the support member 151 to serve as a lead for supplying power and a heat dissipation path. The first to third connection electrodes 141, 143 and 145 may have a column shape. For instance, the first to third connection electrodes 141, 143 and 145 may have a spherical shape, a cylindrical shape, a polygonal column shape or a random shape. The polygonal column shape may be an equiangular column shape or not, and the embodiment is not limited thereto. The top and bottom surfaces of the first to third connection electrodes 141, 143 and 145 may have a circular shape or a polygonal shape, but the embodiment is not limited thereto. The bottom surface area of the first to third connection electrodes 141, 143 and 145 may be different from the top surface area of the first to third connection electrodes 141, 143 and 145. For instance, the bottom surface area of the first to third connection electrodes 141, 143 and 145 may be larger or smaller than the top surface area of the first to third connection electrodes 141, 143 and 145.

At least one of the first to third connection electrodes 141, 143 and 145 is smaller than a width of a bottom surface of the light emitting structure 120 and larger than a diameter or a width of a bottom surface of the first to third electrodes 135, 137 and 139.

The diameter or the width of the first to third connection electrodes 141, 143 and 145 is in the range of 1 μm to 100,000 μm and the height of first to third connection electrodes 141, 143 and 145 is in the range of 1 μm to 100,000 μm. The height H1 of the first and third connection electrodes 141 and 145 may be longer than the height H2 of the second connection electrode 143 and bottom surfaces of the first to third connection electrodes 141, 143 and 145 may be aligned on the same plane (that is, horizontal plane). The bottom surfaces of the first to third connection electrodes 141, 143 and 145 may be aligned on the same horizontal plane with the planar bottom surface S6 of the support member 151 and at least a part of the bottom surfaces of the first to third connection electrodes 141, 143 and 145 may be aligned on the different plane. The thickness direction of the first to third connection electrodes 141, 143 and 145 is the same as the thickness direction of the light emitting structure 120.

The first to third connection electrodes 141, 143 and 145 may be prepared as a single layer by using one metal or an alloy. The width and the height of the single layer is in the range of 1 μm to 100,000 μm. For instance, the single layer has the thickness larger than the thickness of the second connection electrode 143.

The first to third connection electrodes 141, 143 and 145 may include one selected from the group consisting of Ag, Al, Au, Cr, Co, Cu, Fe, Hf, In, Mo, Ni, Si, Sn, Ta, Ti, W and an alloy thereof. In order to improve the adhesive strength with respect to the first to third electrodes 135, 137 and 139, the first to third connection electrodes 141, 143 and 145 may be disposed with a metal bonding layer including one selected from the group consisting of In, Sn, Ni, Cu and an alloy thereof. At this time, the bonding layer has the thickness in the range of 1 Å to 100,000 Å.

A plating layer can be further disposed on the surfaces of the first to third connection electrodes 141, 143 and 145. The plating layer may include Tin or an alloy thereof, Ni or an alloy thereof, or Tin-Ag—Cu. At this time, the plating layer may have a thickness of about 0.5 μm to 10 μm. The plating layer can improve the bonding strength with respect to other bonding layers.

The light emitting device 106 is mounted through the flip scheme, so the most of light is emitted toward the top surface S1 of the substrate 111 and some light is emitted through the lateral sides of the substrate 111 and the light emitting structure 120. Thus, the light loss caused by the first to third electrodes 135 to 139 can be reduced. Accordingly, the light extraction efficiency and heat dissipation efficiency of the light emitting device 106 can be improved.

Figure 17:
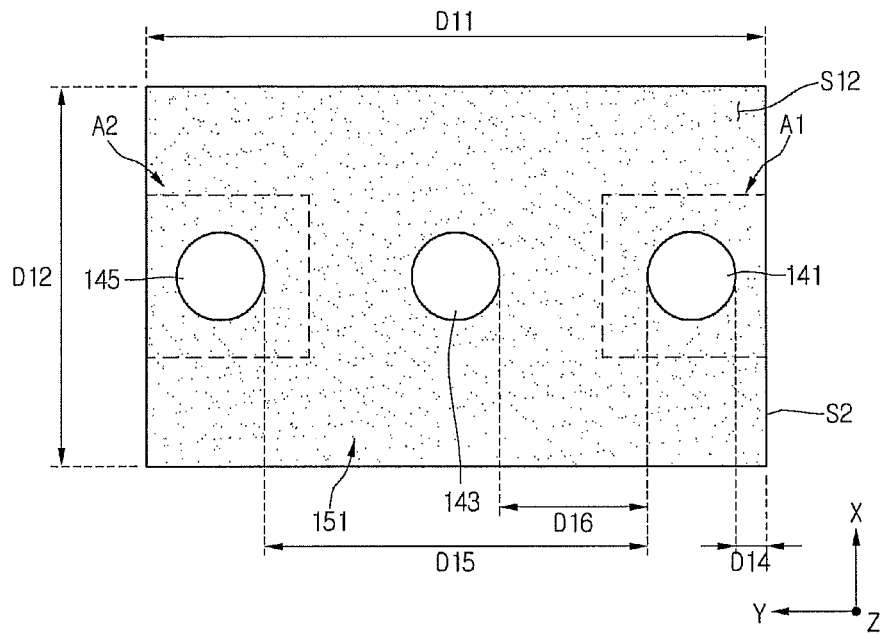
FIGS. 17 to 19 are views showing examples of first to third connection electrodes of a light emitting device shown in FIG. 16.
Figure 18:
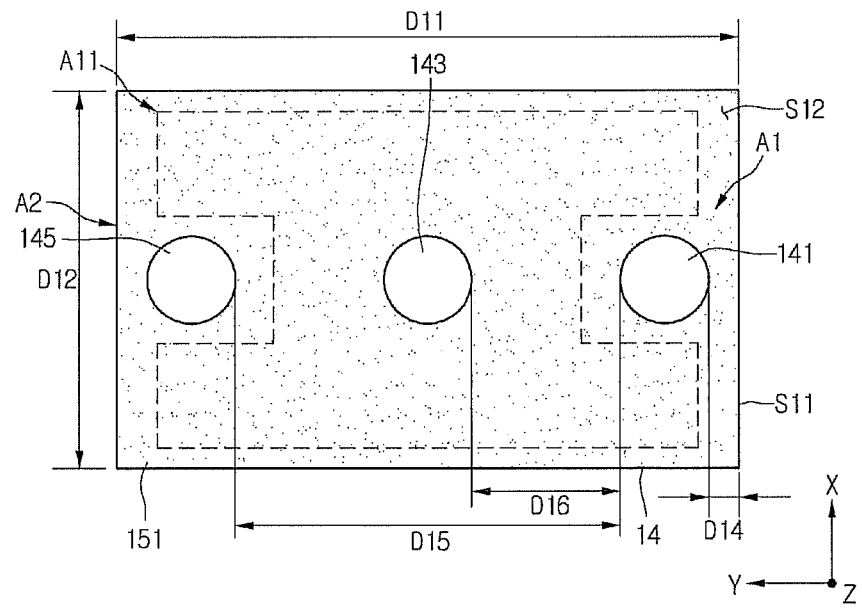

Referring to FIGS. 16, 17 and 18, the first to third connection electrodes 141, 143 and 145 can be aligned in series in the support member 151, for instance, can be aligned in series in the X-axis direction. Bottom surfaces of the first to third connection electrodes 141, 143 and 145 are exposed to the bottom surface S12 of the support member 151 while being spaced apart from the lateral side S11 of the support member 151.

Centers of the first to third connection electrodes 141, 143 and 145 may be aligned on the same line with each other in the straight direction or diagonal direction. The first and third connection electrodes 141 and 145 are connected to the first conductive semiconductor layer 115 so that the first and third connection electrodes 141 and 145 are electrically connected to each other. In addition, the current may spread to mutually different regions of the first conductive semiconductor layer 115.

The second connection electrode 143 supplying the power having the second polarity is disposed at the center region and the first and third connection electrodes 141 and 145 supplying the power having the first polarity are disposed at both sides of the second connection electrode 143 at the lower portion of the light emitting device 106, so the confusion for the position of the first and second polarities can be solved and the mounting failure can be prevented. That is, since the polarities of the connection electrodes 141, 143 and 145 may not be recognized to the naked eye, the connection electrode having one polarity is positioned at the center region to prevent the degradation of the product yield caused by the mounting failure of the light emitting device.

A length D11 of a first lateral side among lateral sides S11 of the support member 151 is substantially the same as a length of a first lateral side of the substrate 111 and a length D12 of a second lateral side of the support member 151 is substantially the same as a length of a second lateral side of the substrate 111. In addition, a distance D15 between the first and third connection electrodes 141 and 145 is an interval between two adjacent electrode pads and corresponds to ½ or more with respect to the length of one lateral side of the light emitting device. Further, the lateral side S11 of the support member 151 may be aligned on the same plane (that is, vertical plane) with the lateral sides of the light emitting structure 120 and the substrate 111.

An interval D16 between the first and second connection electrons 141 and 143 may be narrower than an interval D5 between the first and third connection electrodes 141 and 145. Since the first and third connection electrodes 141 and 145 are spaced apart from each other by the interval D15, the current can be spread over the whole region of the light emitting device.

The bottom surface of the support member 151 is substantially flat or irregular, but the embodiment is not limited thereto.

The support member 151 makes contact with peripheral portions of the first to third electrodes 135 to 139 and the first to third connection electrodes 141 to 145. Thus, the heat transferred from the first to third electrodes 135 to 139 and the first to third connection electrodes 141 to 145 can be diffused and dissipated through the support member 151. Since the thermal diffusion agent is provided in the support member 151, the thermal conductivity can be improved and the heat can be dissipated through the whole surface of the support member 151. Therefore, the reliability of the light emitting device 106 against heat can be improved.

Referring to FIG. 18, the light emitting device includes a third region A11 for connecting the first and second regions A1 and A2 with each other. The third region A11 is etched such that the first conductive semiconductor layer 115 is partially exposed and a connection pattern for connecting the first and third electrodes 135 and 139 with each other may be disposed in the third region A11. Thus, the first and third electrodes 135 and 139 can be commonly connected to the first and third connection electrodes 141 and 145 and the first conductive semiconductor layer 115.

Figure 19:
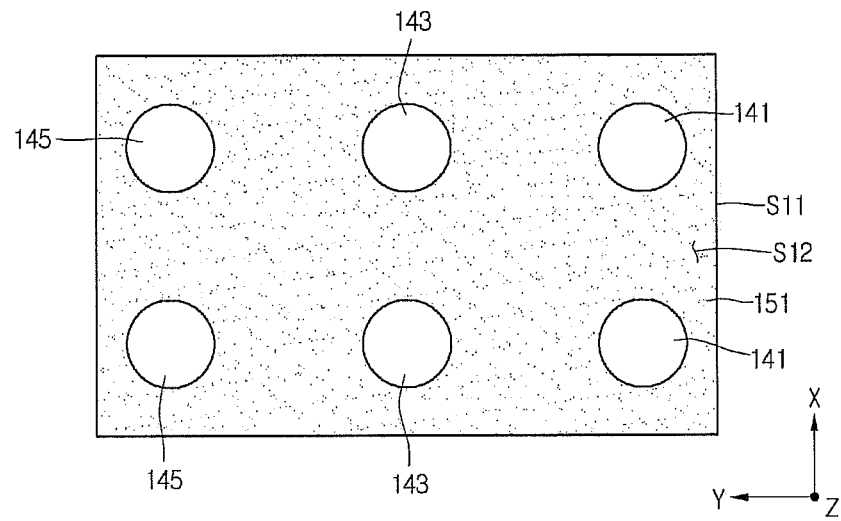

Referring to FIG. 19, in the support member 151, the first to third connection electrodes 141, 143 and 145 are exposed to the bottom surface S12 of the support member 151 and aligned in the support member 151 in at least two rows, for instance, aligned in the X-axis direction in at least two rows.

Figure 20:
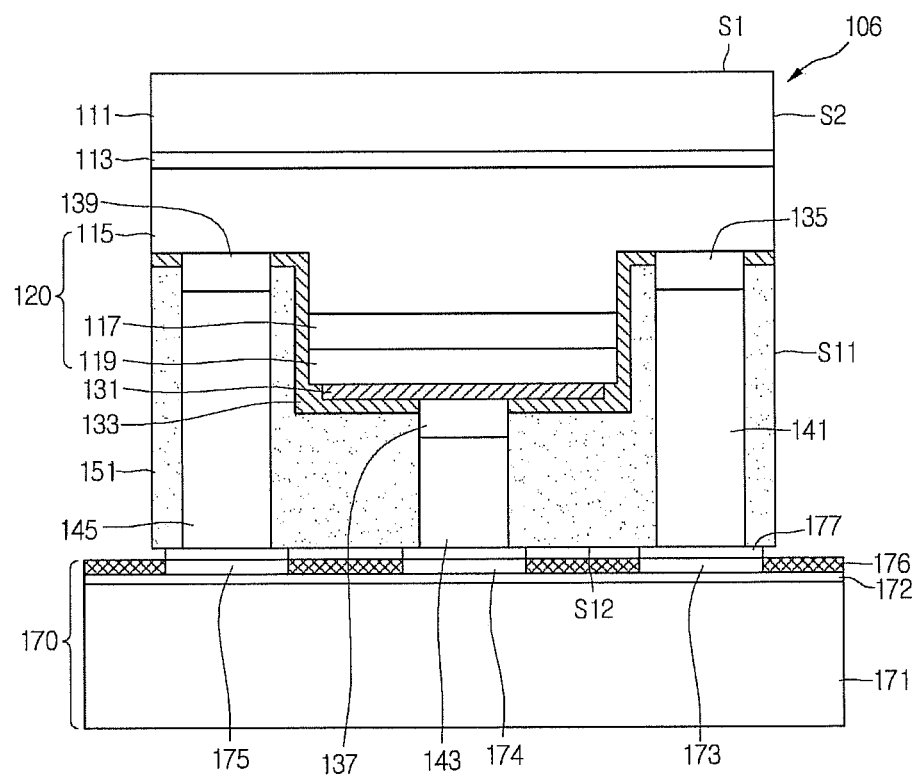
FIG. 20 is a side sectional view showing a light emitting module having a light emitting device according to the seventh embodiment.

FIG. 20 is a side sectional view showing a light emitting module having the light emitting device of FIG. 16.

Referring to FIG. 20, a module substrate 170 includes first to third pads 173, 174 and 175, in which the first connection electrode 141 of the light emitting device 106 is provided over the first pad 173, the second connection electrode 143 of the light emitting device 106 is provided over the second pad 174, and the third connection electrode 145 of the light emitting device 106 is provided over the third pad 175. The first to third pads 173, 174 and 175 are bonded to the first to third connection electrodes 141, 143 and 145 by a bonding material 177, that is, by a bonding member There is no change in electric polarity even if the position of the first and third connection electrodes 141 and 145 is interchanged when they are connected to the first and third pads 173 and 175. For instance, the third connection electrode 145 may be connected onto the first pad 174 and the first connection electrode 141 may be connected onto the third pad 175 and the light emitting device 106 can normally operate even in the above circuit configuration.

The second connection electrode 143 supplying the power having the second polarity is disposed at the center region and the first and third connection electrodes 141 and 145 supplying the power having the first polarity are disposed at both sides of the second connection electrode 143 at the lower portion of the light emitting device 106, so the confusion for the position of the first and second polarities can be solved and the mounting failure can be prevented. That is, when the polarities of the connection electrodes 141, 143 and 145 are not recognized to the naked eye through the support member 151, the connection electrode having one polarity is positioned at the center region to prevent the degradation of the product yield caused by the mounting failure of the light emitting device.

The light emitting device 106 is operated by the power supplied from the first to third connection electrodes 141, 143 and 145 and the heat transferred from the first to third connection electrodes 141, 143 and 145 is dissipated to the outside through the whole surface of the support member 151. The bottom surface of the support member 151 is spaced apart from the top surface of the module substrate 170 by a distance corresponding to a thickness of the bonding material 174.

The bottom surfaces of the first to third connection electrodes 141, 143 and 145 and the support member 151 of the light emitting device 106 may be spaced apart from the top surface of the module substrate 170 at the same interval.

Although only one light emitting device 106 is disposed on the module substrate 170, a plurality of light emitting device can be arrayed on the module substrate 170 and the embodiment is not limited thereto.

Figure 21:
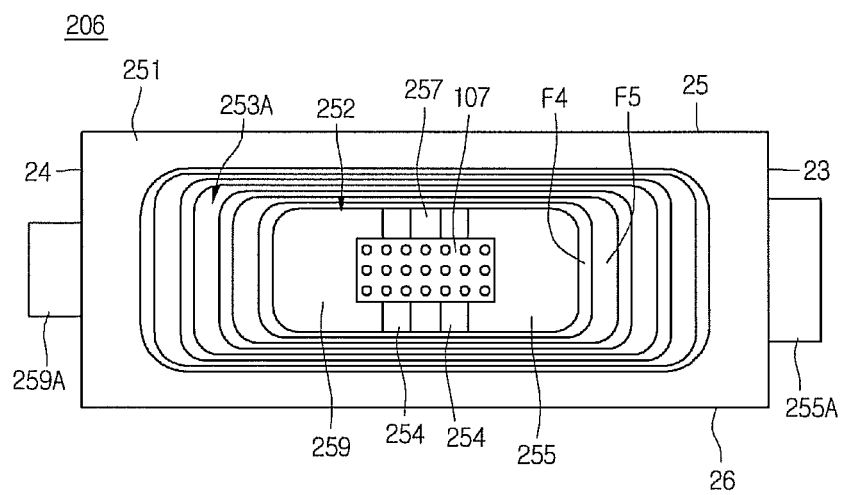
FIG. 21 is a plan view showing a light emitting device package having a light emitting device according to the eighth embodiment.
Figure 22:
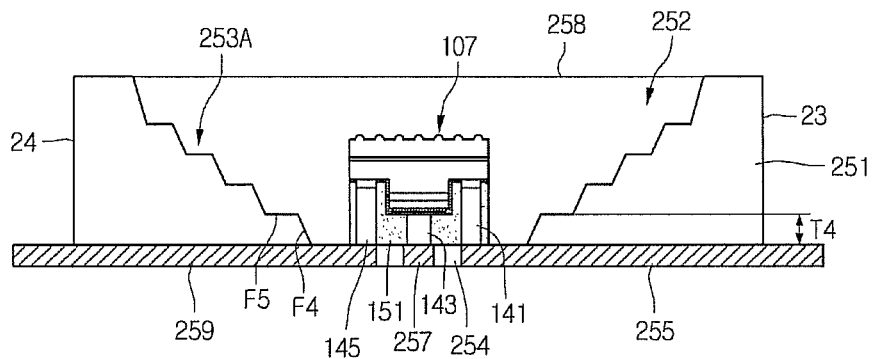
FIG. 22 is a side sectional view of a light emitting device package shown in FIG. 21.
Figure 23:
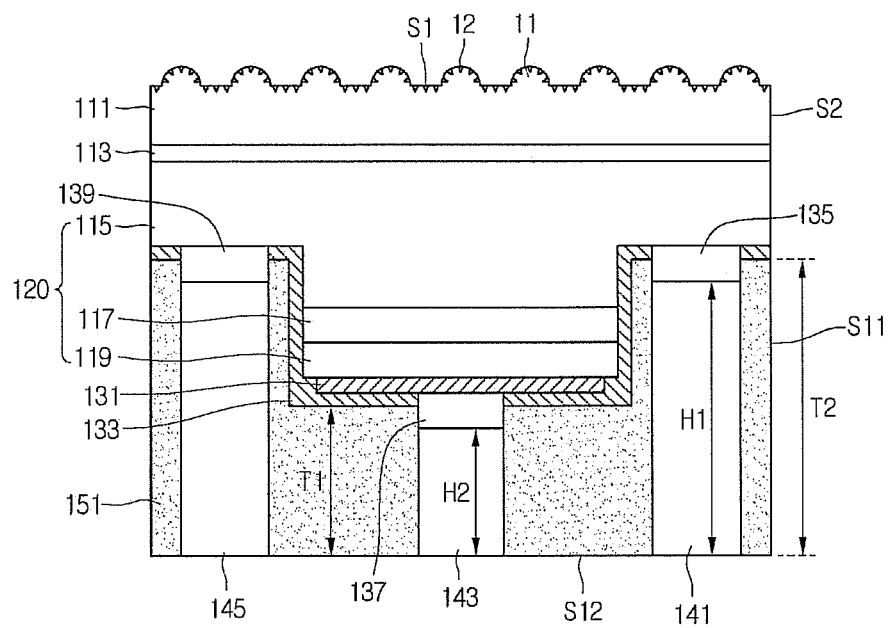
FIG. 23 is a side sectional view of a light emitting device shown in FIG. 21.

FIG. 21 is a plan view showing a light emitting device package having a light emitting device according to the eighth embodiment, FIG. 22 is a side sectional view of the light emitting device package shown in FIG. 21, and FIG. 23 is a side sectional view of the light emitting device shown in FIG. 21. In the following description of the eighth embodiment, refer to the first embodiment for the parts the same as those of the first embodiment.

Referring to FIGS. 21 and 22, the light emitting device package 206 includes a body 251 having a cavity 252, first to third lead electrodes 255, 257 and 259 at least a part of which is disposed in the cavity 252, a molding member 258 and a light emitting device 107.

The first lead electrode 255 is disposed in the region adjacent to the first lateral side 23 of the body 252, the third lead electrode 259 is disposed in the region adjacent to the second lateral side 24 of the body 251, and the second lead electrode 257 is disposed between the first and third lead electrodes 255 and 259 in the bottom of the cavity 252. Gap portions 254 are disposed between the first and second lead electrodes 255 and 257 and between the second and third lead electrodes 257 and 259, respectively.

The first lead electrode 255 may be disposed under the first lateral side 23 of the body 251 and a part 255A of the first lead electrode 255 may protrude out of the body 251. The second lead electrode 257 may be disposed under at least one of third and fourth lateral sides 25 and 26 of the body 251 and a part of the second lead electrode 257 may protrude out of the body 251.

The third lead electrode 259 may be disposed under the second lateral side 24 of the body 251 and a part 259A of the third lead electrode 259 may protrude beyond the second lateral side 24.

In the light emitting device 107, the first and third connection electrodes 141 and 145 are disposed on the first and third lead electrodes 255 and 259 and electrically connected to the first and third lead electrodes 255 and 259. The second lead electrode 257 of the light emitting device 107 is disposed on the second connection electrode 143 and electrically connected to the second connection electrode 143.

A concave portion as shown in FIG. 7 may be disposed in the bottom of the cavity 252. The first to third lead electrodes 255, 257 and 259 are disposed in the concave portion and the lower portion of the light emitting device 107 is electrically connected to the first to third lead electrodes 255, 257 and 259 in the concave portion. Refer to FIG. 7 for the detailed structure of the concave portion.

An upper width of the cavity 252 may be wider than a lower width of the cavity 252. In detail, the cavity 252 may be gradually widened from the lower portion to the upper portion thereof. A sidewall 253A of the cavity 252 includes a plurality of first inclined reflective portions F1 and second reflective portions F2 for connecting the first inclined reflective portions F1. The thickness T4 of the first reflective portion F1 is thinner than the thickness of the support member 151 and may be in the range of 1 μm~100,000 μm or 50 μm~4,000 μm.

The first reflective portions F1 may be continuously or discontinuously disposed along the peripheral surface of the cavity 252. For instance, the first reflective portions F1 may be disposed on two opposite lateral sides of the cavity 252 without being disposed on remaining two opposite lateral sides of the cavity 252. The second reflective portions F2 may be configured as flat surfaces parallel to each other or inclined surfaces having the inclination angle different from that of the first reflective portions F1.

FIG. 23 is a side sectional view of the light emitting device shown in FIG. 21.

Referring to FIG. 23, the light emitting device 107 includes a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, a third connection electrode 145 and a support member 151.

The first and third connection electrodes 141 and 145 are electrically connected to first and third electrodes 135 and 135A disposed on the first conductive semiconductor layer 115 and the second connection electrode 143 is connected to the second conductive semiconductor layer 119 through the second electrode 137.

The first and third connection electrodes 141 and 145 are spaced apart from the second connection electrode 143 and opposite to or symmetrical to each other about the second connection electrode 143, but the embodiment is not limited thereto. An interval between the first and third connection electrodes 141 and 145 may be narrower than an interval between the first and second connection electrodes 141 and 143, but the embodiment is not limited thereto.

According to the embodiment, a region A2 where the third connection electrode 145 is disposed is subject to the etching process. However, it is also possible to form the third connection electrode 145 after connecting the first and third electrodes 135 and 135A to each other.

At least one of first and second pattern sections 11 and 12 may be disposed on the substrate 111. The first pattern section 11 is configured as a first concavo-convex structure having a plurality of protrusions protruding from the top surface S1 of the substrate 111 and the second pattern section 12 is configured as a second concavo-convex structure having a plurality of recesses in the first concavo-convex structure. The second concavo-convex structure is disposed on the first concavo-convex structure and defined by a micro concavo-convex configuration having a size smaller than a size of the protrusions.

The protrusions of the first pattern section 11 may protrude from the top surface S1 of the substrate 111 or may have an embossing shape. According to another example, the first pattern section 11 may be recessed or engraved with a small depth lower than the top surface of the substrate 111. The concaves of the second pattern section 12 may be disposed on the surface of the first pattern section 11 in an intaglio shape or a recess shape with a size smaller than a size of the protrusions of the first pattern section 11. According to another example, the second pattern section 12 may have an embossing shape or a convex shape and may be disposed with micro protrusions having a size smaller than that of the protrusions of the first pattern section 11. The first pattern section 11 may be aligned in the form of a matrix or a lattice. The protrusions of the first pattern section 11 may have a side sectional shape of a hemisphere, a cone, a polygonal cone, a column, such as a cylinder or a polygonal column, or a truncated cone. When viewed from the top, each protrusion may have a circular shape, a polygonal shape, or a mixed shape of a sphere and a planar surface.

The concaves of the second pattern section 12 may have a side sectional shape of a hemisphere, a cone, a polygonal cone, a column, such as a cylinder or a polygonal column, or a truncated cone. When viewed from the top, the second pattern section 12 may have a circular shape, a polygonal shape, or a mixed shape of a sphere and a planar surface.

The first and second pattern sections 11 and 12 change the critical angle of the incident light to reduce the ratio of the total reflection of the light, thereby improving the light extraction efficiency. Thus, if the light emitting device is disposed in the cavity of the light emitting device package shown in FIG. 1, the light extraction efficiency can be more improved.

A phosphor layer may be disposed on the substrate 111. The phosphor layer may make contact with the first and second pattern sections 11 and 12 of the substrate 111 or may be spaced part from the first and second pattern sections 11 and 12 of the substrate 111, and the embodiment is not limited thereto.

FIGS. 24 to 29 are views showing a process of fabricating a light emitting device shown in FIG. 16. Although the following description is made based on the individual device to facilitate the explanation, the light emitting device is manufactured in the wafer level and the individual device is manufactured through the process described later. However, the manufacture of the individual device is not limited to the process described later, but the process steps may be increased or reduced to manufacture the individual device.

Figure 24:
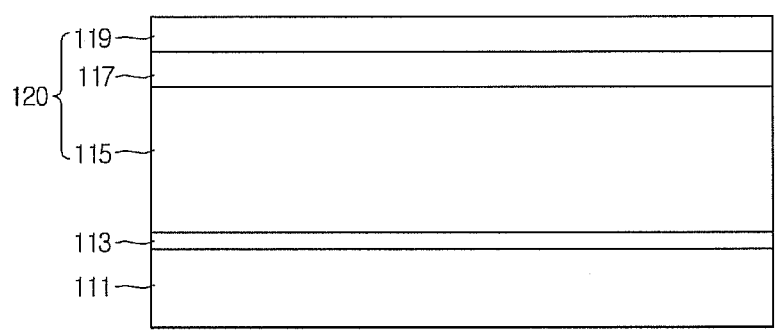
FIGS. 24 to 29 are views showing a process of fabricating a light emitting device shown in FIG. 16.

Referring to FIG. 24, the substrate 111 is loaded in growth equipment, and the compound semiconductor including group II to VI elements is disposed on the substrate 111 in the form of a layer or a pattern. The substrate 111 serves as a growth substrate.

The substrate 111 may include a transparent substrate, an insulating substrate or a conductive substrate. For instance, the substrate 111 may include one selected from the group consisting of Al2O3, GaN, SiC, ZnO, Si, GaP, InP, Ga2O3, and GaAs. The substrate 111 may be disposed on the top surface thereof with a light extracting structure, such as a concavo-convex pattern. The concavo-convex pattern varies the critical angle of the light, thereby improving the light extraction efficiency.

The growth equipment includes an E-beam evaporator, PVD (physical vapor deposition) equipment, CVD (chemical vapor deposition) equipment, PLD (plasma laser deposition) equipment, a dual-type thermal evaporator, sputtering equipment, or MOCVD (metal organic chemical vapor deposition) equipment, but the embodiment is not limited thereto.

The first semiconductor layer 113 is disposed on the substrate 111. The first semiconductor layer 113 can be disposed by using the compound semiconductor including the group III-V elements. The first semiconductor layer 113 may serve as a buffer layer to reduce the lattice mismatch with respect to the substrate. The first semiconductor layer 113 may be an undoped semiconductor layer including a GaN-based semiconductor, which is not intentionally doped.

The light emitting structure 120 may be disposed on the first semiconductor layer 113. The light emitting structure 120 includes the first conductive semiconductor layer 115, the active layer 117 and the second conductive semiconductor layer 119, which are sequentially disposed. Thus, the light emitting structure 120 may have one of an N—P junction structure, a P—N junction structure, an N—P—N junction structure, and a P—N—P junction structure.

Figure 25:
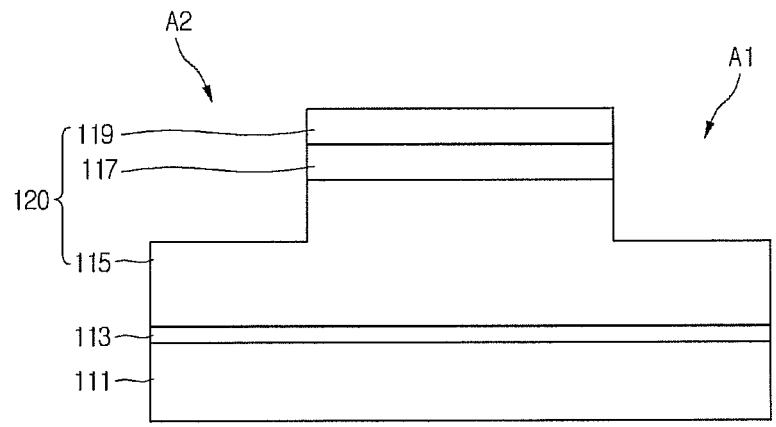

Referring to FIG. 25, the etching process is performed with respect to the first and second regions A1 and A2 of the light emitting structure 120. The first and second regions A1 and A2 of the light emitting structure 120 may expose the first conductive semiconductor layer 115 and the exposed portion of the first conductive semiconductor layer 115 may be lower than a top surface of the active layer 117.

During the etching process, the first region A1 of the light emitting structure 120 is dry-etched after masking the top surface of the light emitting structure 120 using the mask pattern. The dry etching can be performed by using at least one of ICP (Inductively Coupled Plasma) equipment, RIE (Reactive Ion Etching) equipment, CCP (Capacitive Coupled Plasma) equipment, and ECR (Electron Cyclotron Resonance) equipment. The etching process may be performed through the wet etching process and the embodiment is not limited thereto.

The first and second regions A1 and A2 of the light emitting structure 120 are predetermined etching regions and one or a plurality of regions A1 and A2 may be disposed.

Figure 26:
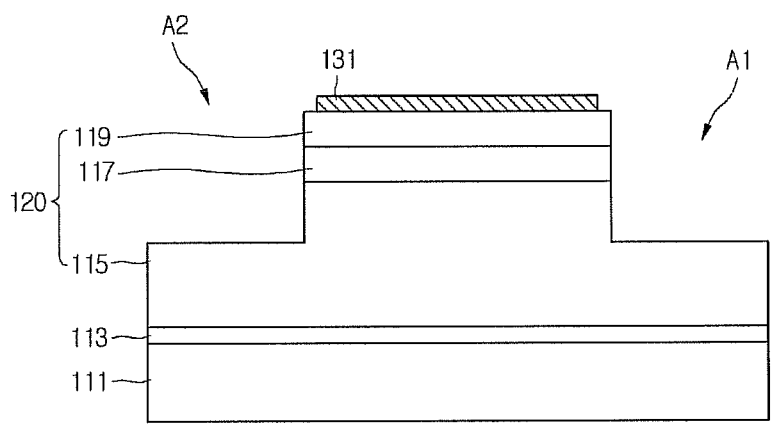

Referring to FIG. 26, the reflective electrode layer 131 is disposed on the light emitting structure 120. The reflective electrode layer 131 has an area smaller than a top surface area of the second conductive semiconductor layer 119 to prevent the short when the reflective electrode layer 131 is manufactured. The reflective layer 131 is deposited by using sputter equipment and/or deposition equipment after masking the region, which is spaced apart from the upper edge by a predetermined distanced, and the first region A1 of the light emitting structure 120 using the mask. The reflective electrode layer 131 may include a material having reflectivity of at least 70% or 90%.

The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, or the reflective layer. Refer to the description of the first embodiment for the material and the thickness of each layer. The processes shown in FIGS. 25 and 26 may be interchanged, and the embodiment is not limited thereto.

Figure 27:
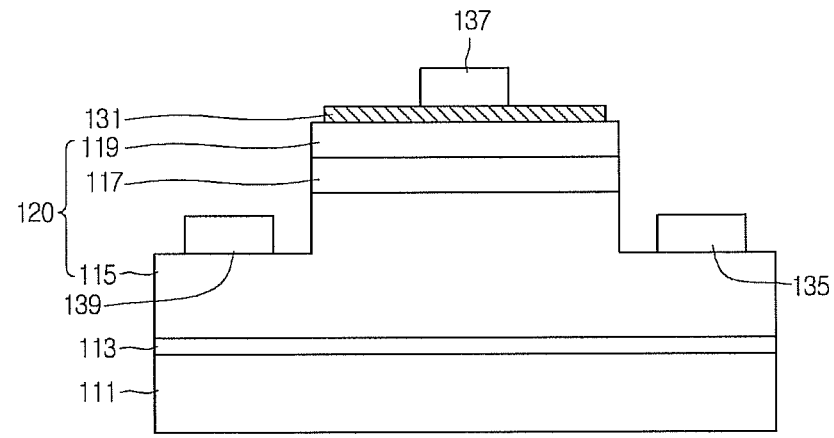

Referring to FIG. 27, the first and third electrodes 135 and 139 are disposed on the first conductive semiconductor layer 115 and the second electrode 137 is disposed on the reflective electrode layer 131. The first to third electrodes 135, 137 and 139 can be disposed by using sputter equipment and/or deposition equipment after masking the region except for the electrode region using the mask, but the embodiment is not limited thereto. The first to third electrodes 135, 137 and 139 may include one selected from the group consisting of Cr, Ti, Co, Ni, V, Hf, Ag, Al, Ru, Rh, Pt, Pd, Ni, Mo, W, La, Ta, Ti and an alloy thereof. The first to third electrodes 135, 137 and 139 may be prepared as multiple layers. For instance, the first to third electrodes 135, 137 and 139 may include at least two of the adhesive layer, the reflective layer, the diffusion barrier layer and the bonding layer disposed by using the above elements. The first to third electrodes 135, 137 and 139 can be disposed to have the same stack structure through the same manufacturing process, but the embodiment is not limited thereto.

The second electrode 137 may physically make contact with the reflective electrode layer 131 and the second conductive semiconductor layer 119.

The insulating layer 133 is disposed on the reflective electrode layer 131 through the sputtering or deposition process. The insulating layer 133 is disposed over the whole area of the reflective electrode layer 131 except for the regions for the first to third electrodes 135, 137, and 139, thereby covering the top surfaces of the reflective electrode layer 131 and the second conductive semiconductor layer 119 and the exposed portion of the first conductive semiconductor layer 115.

The insulating layer 133 includes an insulating material or an insulating resin disposed by using oxide, nitride, fluoride or sulfide including Al, Cr, Si, Ti, Zn or Zr. For instance, the insulating layer 133 may include one selected from the group consisting of SiO2, Si3N4, Al2O3 and TiO2. The insulating layer 133 may be prepared as a single layer or multiple layers, but the embodiment is not limited thereto.

The process for forming the electrodes 135, 137 and 139 shown in FIG. 27 may be interchanged with the process for forming the insulating layer 133 shown in FIG. 26.

Figure 28:
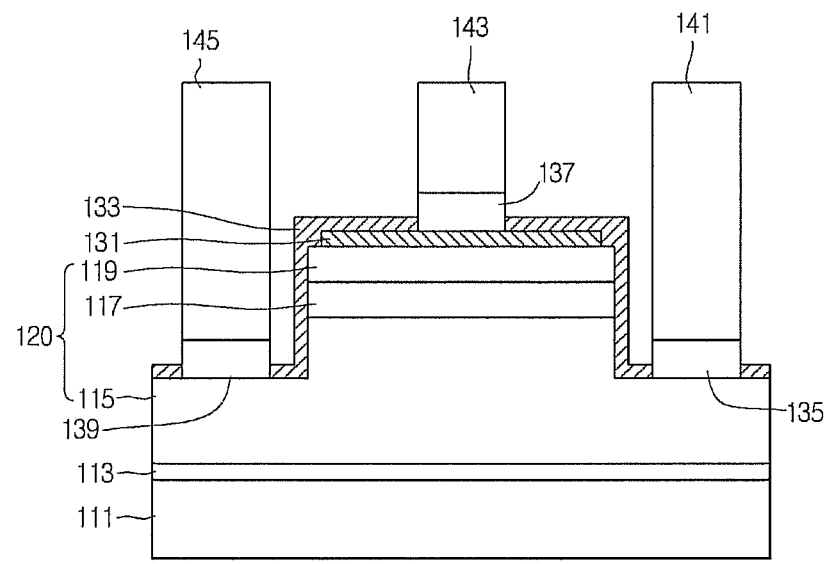

Referring to FIG. 28, the first connection electrode 141 is bonded onto the first electrode 135, the second connection electrode 143 is bonded onto the second electrode 137, and the third connection electrode 145 is bonded onto the third electrode 139. The first and third connection electrodes 141 and 145 include a conductive pad, such as a solder ball and/or a metal bump and are bonded onto the first and third electrodes 135 and 139, respectively. The first and third connection electrodes 141 and 145 can be aligned vertically to the top surface of the first conductive semiconductor layer 115. The second connection electrode 143 includes a conductive pad, such as a solder ball and/or a metal bump and is bonded onto the second electrode 137. The second connection electrode 143 can be aligned vertically to the top surface of the second conductive semiconductor layer 119.

Figure 29:
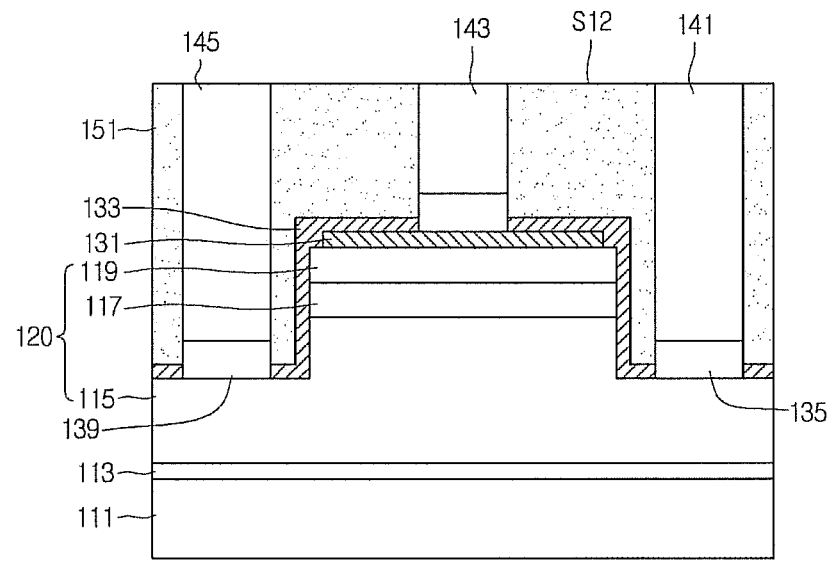

Referring to FIG. 29, the support member 151 is disposed on the insulating layer 133 with a predetermined thickness through the squeegee scheme, the dispensing scheme or the molding scheme. The support member 151 is prepared as an insulating support layer by adding the thermal diffusion agent into a resin, such as silicon or epoxy.

The thermal diffusion agent may include at least one of oxide, nitride, fluoride and sulfide including a Al, Cr, Si, Ti, Zn or Zr. For instance, the thermal diffusion agent may include a ceramic material. The thermal diffusion agent may be defined as a powder particle having a predetermined size, a grain, filler or an additive.

The thermal diffusion agent includes the ceramic material. The ceramic material includes the LTCC (low temperature co-fired ceramic) or the HTCC (high temperature co-fired ceramic). The ceramic material may include metal nitride having thermal conductivity higher than that of nitride or oxide. For instance, the metal nitride may include a material having the thermal conductivity equal to or higher than 140 W/mK. For example, the ceramic material includes one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermal conductive material may include C-component, such as diamond or CNT. In addition, the amount of the thermal diffusion agent added to the support member 151 may be 1~99 wt %. In order to improve the thermal diffusion efficiency, at least 50 wt % of the thermal diffusion agent can be added to the support member 151.

The support member 151 can be disposed by mixing polymer with ink or paste using the ball mill, the planetary ball mill, the impellor mixing, the bead mill or the basket mill. In this case, a solvent and a dispersing agent can be used to uniformly distribute the mixture. The solvent is added to adjust the viscosity. In the case of ink, 3 to 400 Cps of the solvent is added. In addition, in the case of paste, 100 to one million Cps of the solvent is added. The solvent may include one selected from the group consisting of water, methanol, ethanol, isopropanol, butylcabitol, MEK, toluene, xylene, diethyleneglycol (DEG), formamide (FA), α-terpineol (TP), γ-butylrolactone (BL), Methylcellosolve (MCS), Propylmethylcello solve (PM), and a combination thereof. In order to reinforce the coupling strength between particles, silane-based additives, such as 1-Trimethylsilylbut-1-yne-3-ol, Allytrimethylsilane, Trimethylsilyl methanesulfonate, Trimethylsilyl tricholoracetate, Methyl trimethylsilylacetate, or Trimethylsilyl propionic acid, can be added to the solvent. In this case, gelation may occur, so the addition of the silane-based additives must be seriously considered. The support member 151 may be cured at the predetermined temperature, for instance, 200° C.±100° C., and this curing temperature may not exert an influence upon the semiconductor layer.

In the manufacturing process, the connection electrode, such as the solder bump, is previously manufactured and bonded and the support member is provided around the connection electrode. In contrast, after printing or dispensing the insulating layer including the ink or the paste, the insulating layer is cured, and then a conductive material is filled in a hole corresponding to the connection electrode, thereby forming the connection electrode.

The support member 151 is filled around the first to third connection electrodes 141, 143 and 145 and the first to third electrodes 135, 137 and 139. The top surfaces of the first to third connection electrodes 141, 143 and 145 are exposed through the top surface of the support member 151.

The support member 151 is an insulating support layer that supports the first to third connection electrodes 141, 143 and 145. In another example, the first and second connection electrodes 141 and 143 can be disposed after connection electrode holes in the support member 151.

The support member 151 has the thickness corresponding to the top surfaces of the first and second connection electrodes 141 and 143 or sufficient for exposing the top surfaces of the first to third connection electrodes 141, 143 and 145.

Then, the top surface of the substrate 111 is polished such that substrate 111 has the thickness of 300 μm or less, in detail, in the range of 130 μm to 150 μm, for instance, about 150 μm. Since the support member 151 is provided in the light emitting device 100 in opposition to the substrate 111, the substrate 111 can be used as a light emitting layer, so that the thickness of the substrate 111 may become thin. The CMP (chemical mechanical polishing) can be performed with respect to the surfaces of the support member 151 and the first to third connection electrodes 141, 143 and 145, but the embodiment is not limited thereto.

In addition, the etching process is performed with respect to the top surface of the substrate 111 to form a pattern section having a plurality of convex portions. The phosphor layer may be disposed on at least one of the top surface and the lateral sides of the substrate 111. The phosphor layer 161 includes a transparent resin layer containing phosphor. The transparent resin layer includes silicon or epoxy, and the phosphor includes one selected from the group consisting of YAG, TAG, silicate, nitride, and oxy-nitride-based material. The phosphor includes at least one of a red phosphor, a yellow phosphor and a green phosphor and excites a part of the light emitted from the active layer 117 to convert the wavelength of the light. The phosphor layer has the thickness in the range of 1 μm to 100,000 μm or 1 μm to 10,000 μm. The thickness of the phosphor layer is the widthwise length of the light emitting structure 120.

The light emitting device manufactured through the above process is packaged in the wafer level and divided into individual chips through the scribing, breaking and/or cutting work, so that the light emitting device as shown in FIG. 1 can be provided. Since the light emitting device is packaged in the wafer level, the light emitting device can be mounted on the module substrate through the flip bonding scheme without using the wire. In addition, since the light exit surface is aligned toward the top surface and lateral sides of the light emitting structure, other than the electrode, the light loss can be reduced and the brightness and light distribution can be improved.

Figure 30:
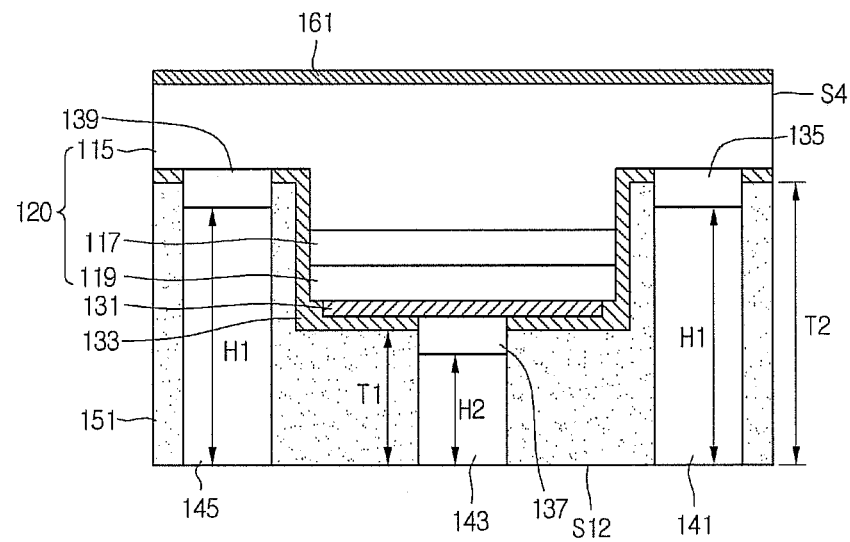
FIG. 30 is a side sectional view showing a light emitting device according to the ninth embodiment.

FIG. 30 is a side sectional view showing a light emitting device according to the ninth embodiment. In the following description of the ninth embodiment, refer to the first embodiment for the parts the same as those of the first embodiment.

Referring to FIG. 30, the light emitting device includes a first conductive semiconductor layer 115, an active layer 117, a second conductive semiconductor layer 119, a reflective electrode layer 131, an insulating layer 133, first to third electrodes 135, 137 and 139, first to third connection electrodes 141, 143 and 145, a support member 151 and a phosphor layer 161.

The substrate shown in FIG. 2 has been removed from the light emitting structure 120 in the light emitting device. The substrate can be removed through one of physical and chemical schemes. For instance, the substrate may be separated from the light emitting structure 120 by irradiating laser onto the substrate, but the embodiment is not limited thereto.

The pattern section, such as the concavo-convex pattern, may be disposed on the top surface of the light emitting structure 120. The pattern section may be disposed by etching the upper portion of the first conductive semiconductor layer 115, but the embodiment is not limited thereto. In addition, the phosphor layer 161 may be disposed on at least the top surface of the light emitting structure 120 from among the top surface and the lateral sides of the light emitting structure 120. The phosphor layer 161 may convert the light emitted from the light emitting structure 120.

The phosphor layer 161 includes a transparent resin layer containing phosphor materials. The transparent resin layer includes silicon or epoxy, and the phosphor material includes one selected from the group consisting of YAG, TAG, silicate, nitride, and oxy-nitride-based material. The phosphor material includes at least one of a red phosphor material, a yellow phosphor material and a green phosphor material and excites a part of the light emitted from the active layer 117 to convert the wavelength of the light.

Figure 31:
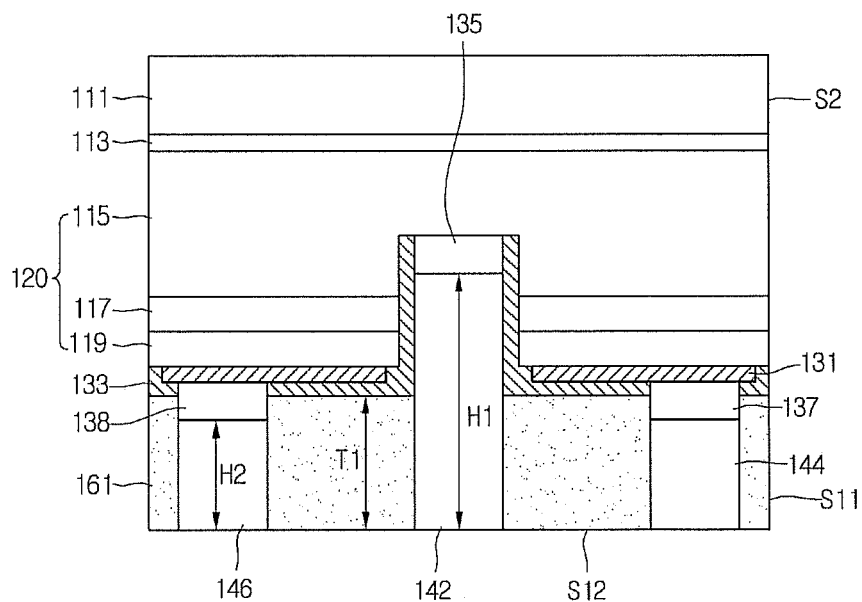
FIG. 31 is a side sectional view showing a light emitting device according to the tenth embodiment.
Figure 32:
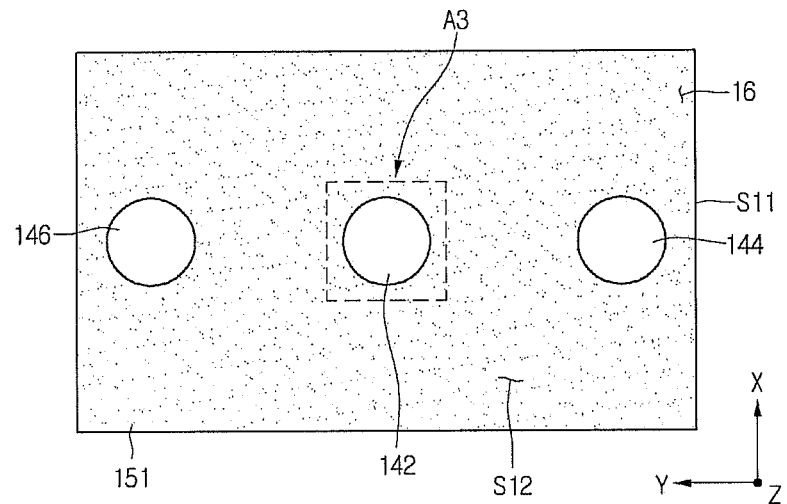
FIG. 32 is a bottom view of a light emitting device shown in FIG. 31 according to the first example.
Figure 33:
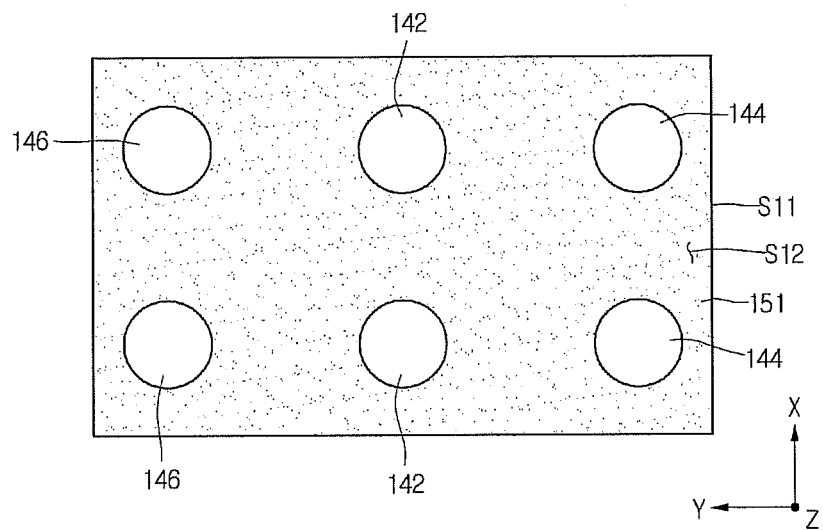
FIG. 33 is a bottom view of a light emitting device shown in FIG. 31 according to the second example.
Figure 34:
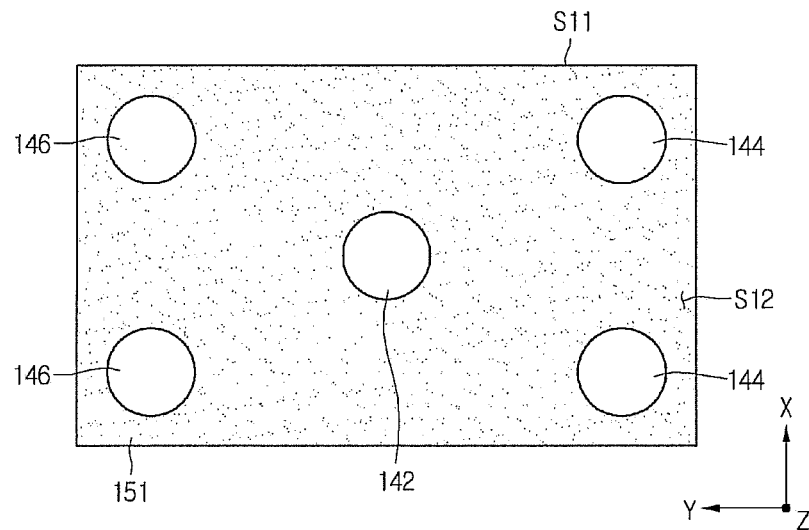
FIG. 34 is a bottom view of a light emitting device shown in FIG. 31 according to the third example.

FIG. 31 is a side sectional view showing a light emitting device according to the tenth embodiment, FIG. 32 is a bottom view of the light emitting device shown in FIG. 31 according to the first example, FIG. 33 is a bottom view of the light emitting device shown in FIG. 31 according to the second example, and FIG. 34 is a bottom view of the light emitting device shown in FIG. 31 according to the third example. In the following description of the tenth embodiment, refer to the first embodiment for the parts the same as those of the first embodiment.

Referring to FIGS. 31 and 32, the light emitting device 108 includes a substrate 111, a first semiconductor layer 113, a first conductive semiconductor layer 115, an active layer 117, a second conductive semiconductor layer 119, a reflective electrode layer 131, an insulating layer 133, first to third electrodes 135, 137 and 138, first to third connection electrodes 142, 144 and 146, and a support member 151.

According to the embodiment, at least one first electrode 135 connected to the first conductive semiconductor layer 115 is disposed at the center region A3 and at least one second electrode 137 and at least one third electrode 138, which are connected to the reflective electrode layer 131, are disposed at both sides of the at least one first electrode 135.

In the support member 151, at least one first connection electrode 142 is disposed under the at least one first electrode 135, at least one second connection electrode 144 is disposed under the at least one second electrode 137, and at least one third connection electrode 146 is disposed under the at least one third electrode 138. The at least one second electrode 137 and at least one third electrode 138 are disposed under the reflective electrode layer 131 and electrically connected to the reflective electrode layer 131. The at least one second electrode 137 and at least one third electrode 138 may be connected to mutually different regions of the reflective electrode layer 131, but the embodiment is not limited thereto.

As shown in FIGS. 31 and 32, the at least one second connection electrode 144 is disposed closer to the lateral side S11 of the support member 151 about the center region at the bottom surface S12 of the support member 151 and the at least one third connection electrode 146 is disposed closer to the lateral side S11 of the support member 151 about the center region at the bottom surface S12 of the support member 151.

At least one of the first to third electrodes 135, 137 and 138 may include a current diffusion pattern having an arm structure or a finger structure branching from the electrode pad. In addition, the first to third electrodes 135, 137 and 138 may include one electrode pad or a plurality of electrode pads, but the embodiment is not limited thereto.

The first to third connection electrodes 142, 144 and 146 are disposed in the support member 151 and exposed to the lower portion of the support member 151 to serve as a lead for supplying power and a heat dissipation path. The first to third connection electrodes 142, 144 and 146 may have a column shape. For instance, the first to third connection electrodes 142, 144 and 146 may have a spherical shape, a cylindrical shape, a polygonal column shape or a random shape. The polygonal column shape may be an equiangular column shape or not, and the embodiment is not limited thereto. The top and bottom surfaces of the first to third connection electrodes 142, 144 and 146 may have a circular shape or a polygonal shape, but the embodiment is not limited thereto. The bottom surface area of the first to third connection electrodes 142, 144 and 146 may be different from the top surface area of the first to third connection electrodes 142, 144 and 146. For instance, the bottom surface area of the first to third connection electrodes 142, 144 and 146 may be larger or smaller than the top surface area of the first to third connection electrodes 142, 144 and 146.

The bottom surfaces of the first to third connection electrodes 142, 144 and 146 may be aligned on the same plane (that is, horizontal plane). The bottom surfaces of the first to third connection electrodes 142, 144 and 146 may be aligned on the same horizontal plane with the planar bottom surface S12 of the support member 151 and at least a part of the bottom surfaces of the first to third connection electrodes 142, 144 and 146 may be aligned on the different plane.

In the support member 151, the first to third connection electrodes 142, 144 and 146 may be aligned in one row as shown in FIG. 14 or in at least two rows as shown in FIG. 15. Centers of the first to third connection electrodes 142, 144 and 146 may be aligned on the same line with each other. The first to third connection electrodes 142, 144 and 146 aligned in mutually different rows may be disposed on the same central line, but the embodiment is not limited thereto. The first and third electrodes 142 and 146 are connected to the second conductive semiconductor layer 119 so that the first and third electrodes 142 and 146 are electrically connected to each other.

According to the above structure, the number of the first electrodes 135 may be smaller than the number of the second and third electrodes 137 and 138, so the area of the active layer 117 can be increased, so that reduction of the light emitting area can be prevented. In addition, there is no change in electric polarity of the light emitting device even if the mounting position of the second and third connection electrodes 144 and 146 is interchanged. The first connection electrode 142 supplying the power having the first polarity is disposed at the center region and the second and third connection electrodes 144 and 146 supplying the power having the second polarity are disposed at both sides of the first connection electrode 142 in the light emitting device, so the confusion for the position of the first and second polarities can be solved and the mounting failure can be prevented. That is, since the polarities of the connection electrodes 142, 144 and 146 may not be recognized to the naked eye through the support member 151, the connection electrode having one polarity is positioned at the predetermined center region to prevent the degradation of the product yield caused by the mounting failure of the light emitting device.

Referring to FIG. 34, the light emitting device includes the second and third connection electrodes 144 and 146 disposed at corner regions of the support member 151. In addition, at least one first connection electrode 142 is disposed at the center region of the support member 151. According to this configuration, the number of the connection electrodes having one polarity may be increased by four times as compared with the number of the connection electrodes having the other polarity. In addition, since the connection electrodes are disposed in each corner region of the support member 151, the current may be diffused over the whole area of the light emitting structure.

Figure 35:
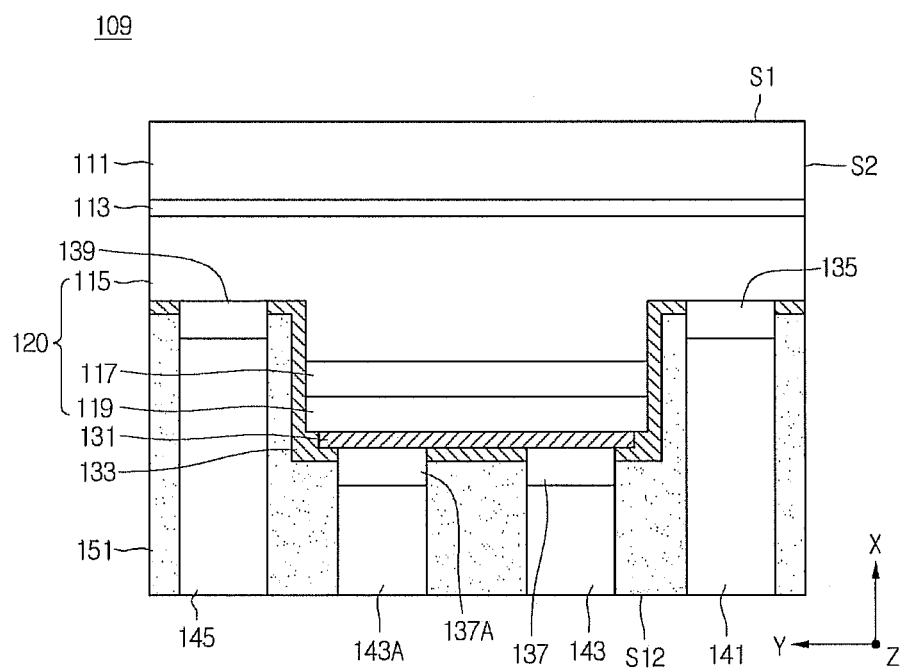
FIG. 35 is a side sectional view showing a light emitting device according to the eleventh embodiment.
Figure 36:
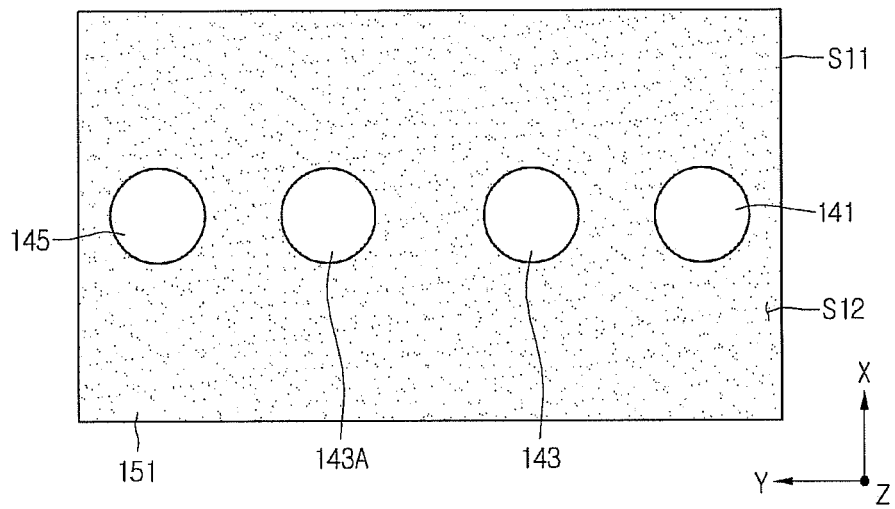
FIG. 36 is a bottom view of a light emitting device shown in FIG. 35 according to the first example.
Figure 37:
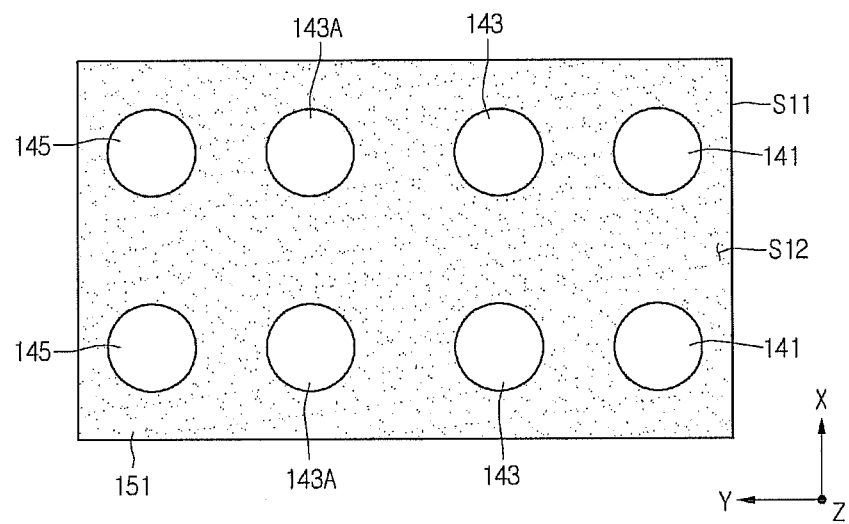
FIG. 37 is a bottom view of a light emitting device shown in FIG. 35 according to the second example.

FIG. 35 is a side sectional view showing a light emitting device according to the eleventh embodiment, FIG. 36 is a bottom view of the light emitting device shown in FIG. 35 according to the first example, and FIG. 37 is a bottom view of the light emitting device shown in FIG. 35 according to the second example. In the following description of the eleventh embodiment, refer to the first embodiment for the parts the same as those of the first embodiment.

Referring to FIG. 35, the light emitting device 109 includes a substrate 111, a first semiconductor layer 113, a first conductive semiconductor layer 115, an active layer 117, a second conductive semiconductor layer 119, a reflective electrode layer 131, an insulating layer 133, first and third electrodes 135 and 139, a plurality of second electrodes 137 and 137A, first and third connection electrodes 141 and 145, a plurality of second connection electrodes 143 and 143A, and a support member 151.

The light emitting device includes the second electrodes 137 and 137A and the second connection electrodes 143 and 143A at the center region of the support member 151. The second connection electrodes 143 and 143A may be connected to at least one of the second electrodes 137 and 137A, and the embodiment is not limited thereto. The second connection electrodes 143 and 143A may be spaced apart from each other and electrically connected to the reflective electrode layer 131.

The first and third electrodes 135 and 139 are disposed between the first conductive semiconductor layer 115 and the first and third connection electrode 141 and 145.

In the support member 151, the first to third connection electrodes 141, 143, 143A, and 145 may be aligned in one row as shown in FIG. 36 or in at least two rows as shown in FIG. 37. In another example, in the support member 151, the first connection electrode 141 is aligned in a first row, at least one of the second connection electrodes 143 and 143A is aligned in a second row, and the third connection electrode 145 is aligned in at least one of the first and second rows or may deviate from the rows, but the embodiment is not limited thereto.

Figure 38:
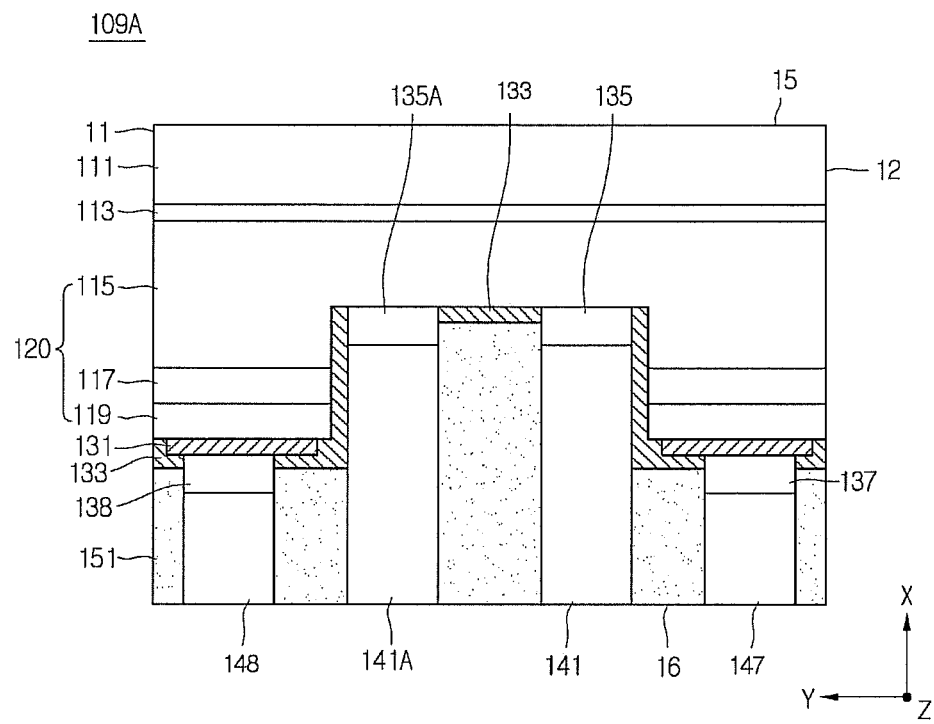
FIG. 38 is a side sectional view showing a light emitting device according to the twelfth embodiment.
Figure 39:
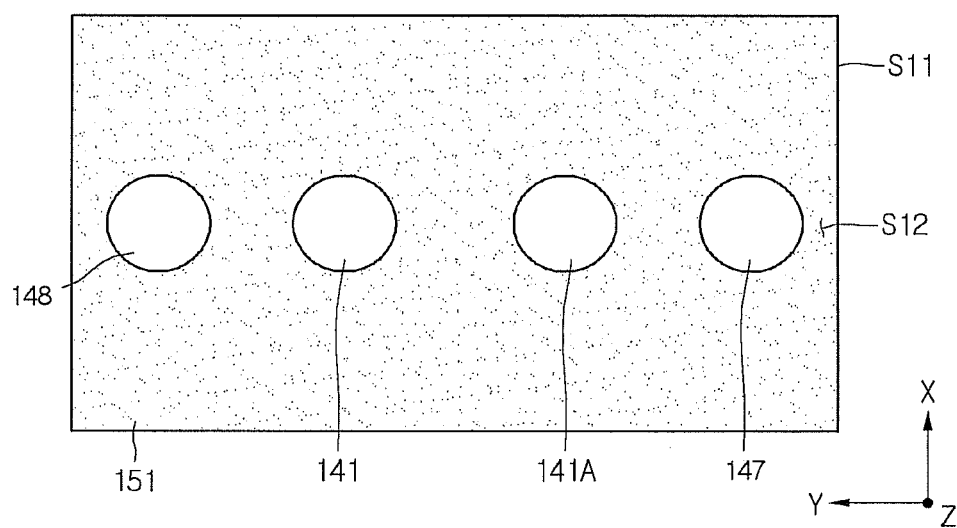
FIG. 39 is a bottom view of a light emitting device shown in FIG. 38 according to the first example.
Figure 40:
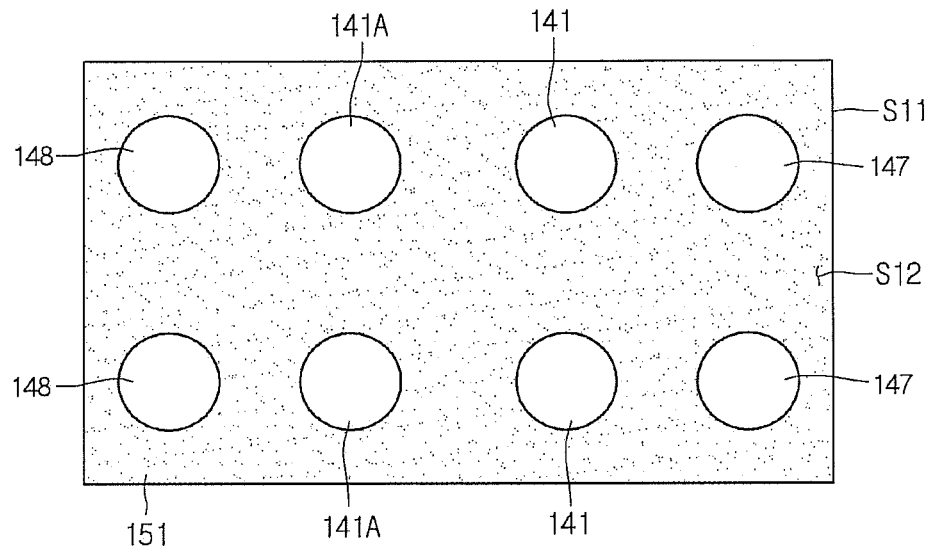
FIG. 40 is a bottom view of a light emitting device shown in FIG. 38 according to the second example.

FIG. 38 is a side sectional view showing a light emitting device according to the twelfth embodiment, FIG. 39 is a bottom view of the light emitting device shown in FIG. 38 according to the first example, and FIG. 40 is a bottom view of the light emitting device shown in FIG. 38 according to the second example. In the following description of the twelfth embodiment, refer to the first embodiment for the parts the same as those of the first embodiment.

Referring to FIG. 38, the light emitting device 109A includes a substrate 111, a first semiconductor layer 113, a first conductive semiconductor layer 115, an active layer 117, a second conductive semiconductor layer 119, a reflective electrode layer 131, an insulating layer 133, a plurality of first electrodes 135 and 135A, second and third electrodes 137 and 138, a plurality of first connection electrodes 141 and 141A, second and third connection electrodes 147 and 148, and a support member 151.

The light emitting device 109A includes the first electrodes 135 and 135A and the first connection electrodes 141 and 141A at the center region of the support member 151. The first connection electrodes 141 and 141A may be connected to at least one of the first electrodes 135 and 135A, or connected to the first electrodes 135 and 135A in one-to-one correspondence, but the embodiment is not limited thereto. The first connection electrodes 141 and 141A may be spaced apart from each other and are electrically insulated from the second and third electrodes 147 and 148, but the embodiment is not limited thereto.

In the support member 151, the first to third connection electrodes 141, 141A, 147 and 148 may be aligned in one row as shown in FIG. 39 or in at least two rows as shown in FIG. 40. In another example, in the support member 151, the first connection electrode 141 is aligned in a first row, at least one of the first connection electrodes 141A is aligned in a second row, and the second connection electrodes 147 and 148 are aligned in at least one of the first and second rows or may deviate from the rows, but the embodiment is not limited thereto.

Figure 41:
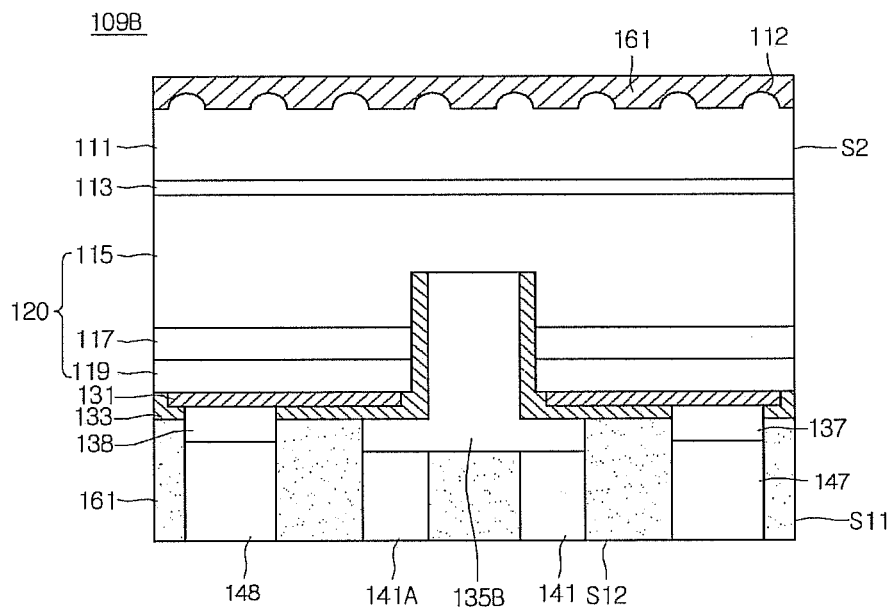
FIG. 41 is a side sectional view showing a light emitting device according to the thirteenth embodiment.

FIG. 41 is a side sectional view showing a light emitting device according to the thirteenth embodiment.

Referring to FIG. 41, the light emitting device 109B includes a substrate 111, a first semiconductor layer 113, a first conductive semiconductor layer 115, an active layer 117, a second conductive semiconductor layer 119, a reflective electrode layer 131, an insulating layer 133, a first electrode 135B, second and third electrodes 137 and 138, a plurality of first connection electrodes 141 and 141A, second and third connection electrodes 147 and 148, and a support member 151.

The first connection electrodes 141 and 141A are disposed on the first electrode 135B and connected to each other. A width of an upper portion of the first electrode 135B making contact with the first conductive semiconductor layer 115 is narrower than a width of a lower portion of the first electrode 135B and the first electrode 135B corresponds to the first connection electrodes 141 and 141A. At least one of a pattern section 112, such as a concave-convex pattern, and a phosphor layer 161 may be disposed on the top surface of the substrate 111.

<Lighting System>

The light emitting device or the light emitting device package according to the embodiment is applicable to a lighting system. The lighting system includes a structure in which plurality of light emitting devices or plurality of light emitting device packages are arrayed. The lighting system includes a display apparatus shown in FIGS. 42 and 43, a lighting apparatus shown in FIG. 44, a lighting lamp, a signal lamp, a headlamp for a vehicle, and an electronic display.

Figure 42:
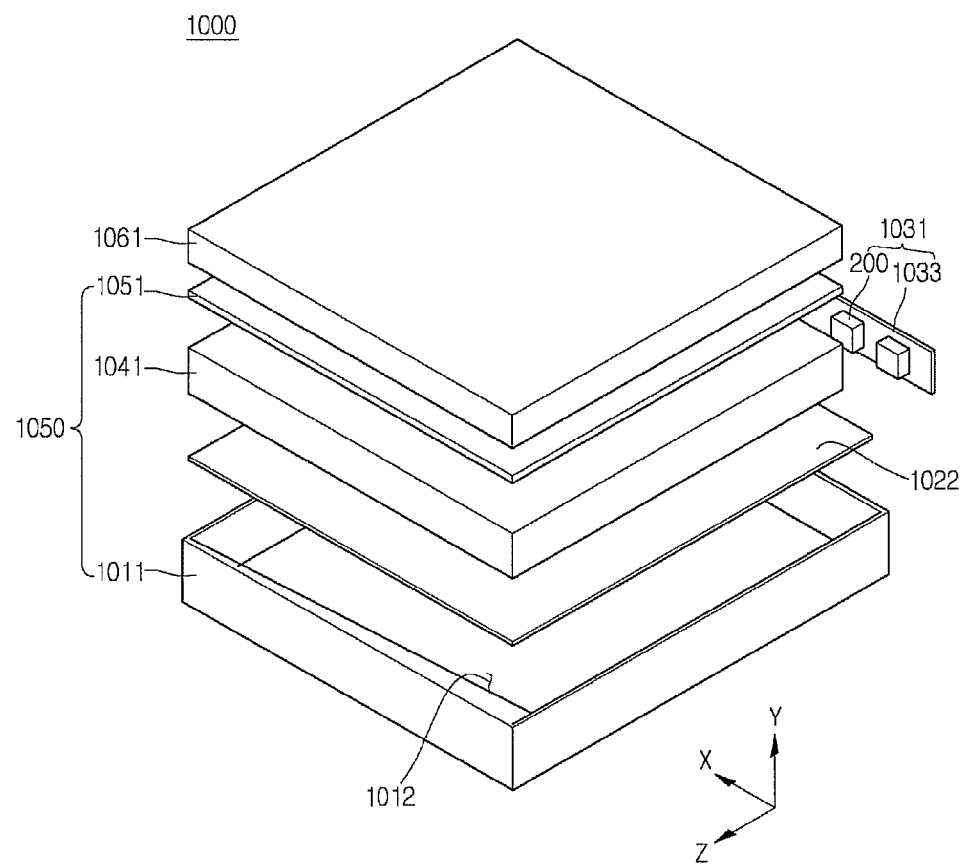
FIG. 42 is a perspective view showing a display apparatus having the light emitting device package according to the embodiment.

FIG. 42 is an exploded perspective view showing a display apparatus having the light emitting device according to the embodiment.

Referring to FIG. 42, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light emitting module 1031 to provide surface light. The light guide plate 1041 may include a transparent material. For example, the light guide plate 1041 may include one of acryl-based resin, such as PMMA (poly methyl methacrylate, PET (polyethylene terephthalate), PC (polycarbonate), COC (cyclic olefin copolymer) and PEN (polyethylene naphtha late) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and the light emitting device according to the embodiments or the light emitting device package 200. The light emitting device package 200 or/and the light emitting device according to the embodiments are arranged on the board 1033 while being spaced apart from each other at the predetermined interval.

The board 1033 may include a printed circuit board (PCB) including a circuit pattern (not shown). In addition, the board 1033 may also include a metal core PCB (MCPCB) or a flexible PCB (FPCB) as well as a typical PCB, but the embodiment is not limited thereto. If the light emitting device package 200 is disposed on the side of the bottom cover 1011 or on a heat dissipation plate, the board 1033 may be omitted. The heat dissipation plate partially makes contact with the top surface of the bottom cover 1011.

In addition, the light emitting device package 200 are arranged such that light exit surfaces to discharge light of the light emitting device package 200 are spaced apart from the light guide plate 1041 by a predetermined distance on the board 1033, but the embodiment is not limited thereto. The light emitting device package 200 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

Figure 43:
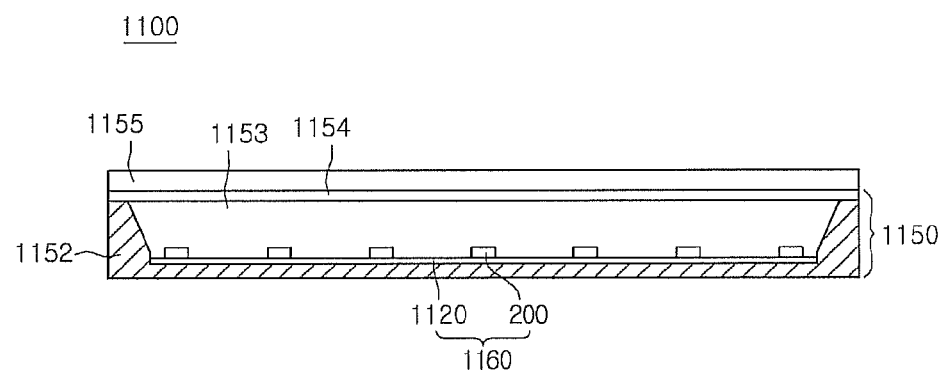
FIG. 43 is a sectional view showing a display apparatus having the light emitting device package according to the embodiment.

FIG. 43 is a sectional view showing a display apparatus according to the embodiment.

Referring to FIG. 43, the display device 1100 includes a bottom cover 1152, a board 1120 on which the light emitting device package 200 are arrayed, an optical member 1154, and a display panel 1155.

The board 1120 and the light emitting device package 200 may constitute the light emitting module 1160. In addition, the bottom cover 1152, at least one light emitting module 1160, and the optical member 1154 may constitute the light unit. The bottom cover 1151 can be disposed with a receiving section 1153, but the embodiment is not limited thereto. The light emitting module 1160 includes a board 1120, and a plurality of light emitting devices arranged on the board 1120 or a light emitting device package 200.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1160 in order to convert the light emitted from the light emitting module 1160 into the surface light.

Figure 44:
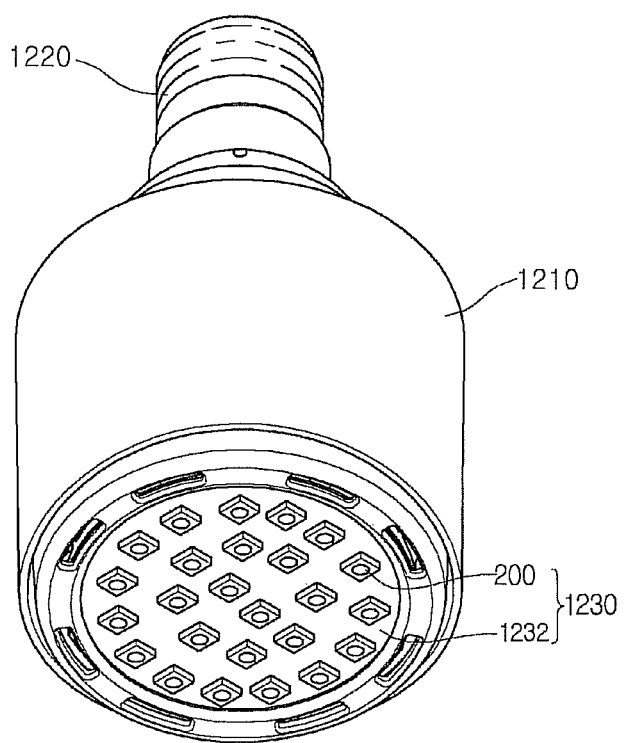
FIG. 44 is a perspective view of a lighting unit having the light emitting device package with the light emitting device.

FIG. 44 is a perspective view of a lighting unit according to an embodiment.

Referring to FIG. 44, the lighting unit 1200 may include a case 1210, a light emitting module 1230 including in the case 1210, and a connection terminal 1220 including in the case 1210 and supplied with an electric power from an external power supply.

The case 1210 may be preferably disposed of a material having good heat shielding characteristics, for example, a metal material or a resin material.

The light emitting module 1230 may include a board 1232, and at least one light emitting device package 00 according to the embodiments mounted on the board 1232. The light emitting device package 200 may include a plurality of light emitting device packages which are arrayed apart by a predetermined distance from one another in a matrix configuration.

The board 1232 may be an insulator substrate on which a circuit pattern is printed, and may include, for example, a printed circuit board (PCB), a metal core PCB, a flexible PCB, a ceramic PCB, an FR-4 substrate, etc.

Also, the board 1232 may be disposed of a material to efficiently reflect light, and a surface thereof may be disposed in a color capable of efficiently reflecting light, for example, white color, or silver color.

The at least one light emitting device package 200 may be mounted on the board 1232. Each of the light emitting device packages 200 may include at least one light emitting diode (LED) chip. The LED chip may include a color LED emitting red, green, blue or white light, and a UV LED emitting ultraviolet (UV).

The light emitting module 1230 may have a combination of various light emitting devices so as to obtain desired color and luminance. For example, the light emitting module 1230 may have a combination of a white LED, a red LED, and a green LED so as to obtain a high color rendering index (CRI).

The connection terminal 1220 may be electrically connected to the light emitting module 1230 to supply power. The connection terminal 1220 may be screwed and coupled to an external power in a socket type, but the present disclosure is not limited thereto. For example, the connection terminal 1220 may be made in a pin type and inserted into an external power, or may be connected to the external power through a power line.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductive semiconductor layer, a second conductive semiconductor layer under the first conductive semiconductor layer and an active layer between the first and second conductive semiconductor layers;
   a support member under the light emitting structure;
   a reflective electrode layer between the second conductive semiconductor layer and the support member;
   an insulating layer disposed between the support member and the reflective layer, wherein the insulating layer directly contacts the reflective layer and the support member; and
   first to third connection electrodes spaced apart from each other in the support member,
   wherein the second connection electrode is disposed between the first and third connection electrodes,
   the first and third connection electrodes are electrically connected with each other, and
   the support member is disposed around lateral surfaces of the first to third connection electrodes,
   wherein the support member is vertically overlapped with the light emitting structure and directly contacts the lateral surfaces of the first to third connection electrodes,
   wherein a thickness of the support member is greater than a thickness of at least one of the first to third connection electrodes,
   wherein a bottom surface of the support member has a width equal to a width of a top surface of the first conductive semiconductor layer in a horizontal direction,
   wherein the bottom surface of the support member has the width equal to a width of the insulating layer in the horizontal direction.

2. The light emitting device of claim 1, further comprising:
   a first electrode between the first conductive semiconductor layer and each of the first and third connection electrodes; and
   a second electrode between the reflective electrode layer and the second connection electrode.

3. The light emitting device of claim 1, further comprising:
   a second electrode between the reflective electrode layer and each of the first and third connection electrodes; and
   a first electrode between the second connection electrode and the first conductive semiconductor layer,
   wherein the first electrode and the second electrode directly contact the support member and the insulating layer.

4. The light emitting device of claim 2, wherein at least one of the first to third connection electrodes includes a plurality of connection electrodes spaced apart from each other.

5. The light emitting device of claim 2, wherein each of the first to third connection electrodes is formed in plurality, and the plurality of first to third connection electrodes are spaced apart from each other.

6. The light emitting device of claim 2, wherein the bottom surfaces of the first to third connection electrodes are exposed to the bottom surface of the support member, wherein an entire region of top surface of the support member is located at a lower position than a top surface of the first electrode.

7. The light emitting device of claim 6, wherein the bottom surface of the support member is aligned on a same plane with the bottom surfaces of the first to third connection electrodes.

8. The light emitting device of claim 6, wherein the support member includes a resin material to which a ceramic material is added, and a lateral side of the support member is aligned on a same plane with a lateral side of the light emitting structure.

9. A light emitting device comprising:
a transparent substrate;
a support member under a bottom surface of the transparent substrate;
a light emitting structure disposed between the transparent substrate and the support member and including a first conductive semiconductor layer, a second conductive semiconductor layer under the first conductive semiconductor layer and an active layer between the first and second conductive semiconductor layers;
a reflective electrode layer between the second conductive semiconductor layer and the support member;
an insulating layer between the reflective electrode layer and the support member, wherein the insulating layer directly contacts the reflective electrode layer and the support member; and
first to third connection electrodes spaced apart from each other in the support member,
wherein the second connection electrode is disposed between the first and third connection electrodes,
the first and third connection electrodes are electrically connected with each other, and
the support member is disposed around lateral surfaces of the first to third connection electrodes,
wherein the support member is vertically overlapped with the light emitting structure and directly contacts the lateral surfaces of the first to third connection electrodes,
wherein the insulating layer is between the first conductive semiconductor layer and the support member,
wherein the insulating layer directly contacts different regions of a lower surface of the first conductive semiconductor layer,
wherein a thickness of the support member is greater than a thickness of at least one of the first to third connection electrodes,
wherein a bottom surface of the support member has a width equal to a width of a top surface of the transparent substrate in a horizontal direction,
wherein the bottom surface of the support member has the width equal to a width of the insulating layer in the horizontal direction.

10. The light emitting device of claim 9, further comprising:
a first electrode between the first conductive semiconductor layer and the first connection electrode;
a second electrode between the reflective electrode layer and the second connection electrode; and
a third electrode between the first conductive semiconductor layer and the third connection electrode.

11. The light emitting device of claim 10, wherein the thickness of the support member is greater than a thickness of the transparent substrate.

12. The light emitting device of claim 9, further comprising a light extracting structure on at least one of the top surface and the bottom surface of the transparent substrate.

13. The light emitting device of claim 9, further comprising a phosphor layer on the transparent substrate.

14. The light emitting device of claim 9, wherein the thickness of the support member is greater than a thickness of the first and second connection electrodes and the bottom surface of the support member is parallel to the top surface of the transparent substrate.

15. The light emitting device of claim 14, wherein the bottom surface of the support member is aligned on a same plane with bottom surfaces of the first to third connection electrodes.

16. The light emitting device of claim 9, wherein the support member includes a resin material to which a ceramic material is added.

17. A light emitting device package comprising:
a body having a cavity;
a first lead electrode in the cavity of the body;
a third lead electrode in the cavity of the body;
a second lead electrode disposed between the first and third lead electrodes in the cavity;
a light emitting device disposed on the first to third lead electrodes and electrically connected to the first to third lead electrodes;
a molding member disposed in the cavity and disposed on a surface of the light emitting device; and
a gap portions disposed among the first to third lead electrodes,
wherein the molding member directly contacts the first lead electrode and the body,
wherein the light emitting device comprises:
a transparent substrate;
a light emitting structure including a first conductive semiconductor layer, a second conductive semiconductor layer under the first conductive semiconductor layer and an active layer between the first and second conductive semiconductor layers, wherein the light emitting structure is disposed between the transparent substrate and the light emitting structure;
a support member under a bottom surface of the light emitting structure;
a reflective electrode layer between the second conductive semiconductor layer and the support member;
an insulating layer between the reflective electrode layer and the support member, wherein the insulating layer directly contacts the reflective electrode layer and the support member; and
first to third connection electrodes spaced apart from each other in the support member;
a first electrode between the first conductive semiconductor layer and the first connection electrode;
a second electrode between the reflective electrode layer and the second connection electrode;
a third electrode between the first conductive semiconductor layer and the third connection electrode, and
wherein the second connection electrode is disposed between the first and third connection electrodes and the second connection electrode is connected to the second lead electrode in the cavity,
the first and third connection electrodes are electrically connected with each other,
the support member is disposed around lateral surfaces of the first to third connection electrodes; and
the first to third lead electrodes are spaced apart from the support member and the first to third connection electrodes at a same interval, wherein the first lead electrode is connected to the first connection electrode and the second lead electrode is connected to the second connection electrode in the cavity, wherein the support member is vertically overlapped with the light emitting structure and directly contacts the lateral surfaces of the first to third connection electrodes, wherein the insulating layer is between the first conductive semiconductor layer and the support member, wherein the insulating layer directly contacts the first conductive semiconductor layer, wherein a thickness of the support member is greater than a thickness of at least one of the first to third connection electrodes, wherein the thickness of the at least one of the first to third connection electrodes is greater than a thickness of each of the first to third electrodes, and wherein a bottom surface area of the support member is substantially equal to a top surface area of the first conductive semiconductor layer, wherein the bottom surface of the support member has a width equal to a width of a top surface of the transparent substrate in a horizontal direction, wherein the bottom surface of the support member has the width equal to a width of the insulating layer in the horizontal direction.

18. The light emitting device of claim 1, wherein a bottom surface area of the support member is substantially equal to a top surface area of the first conductive semiconductor layer.

19. The light emitting device of claim 1, further comprising:
a printed circuit board including plurality of pads under the bottom surface of the support member;
a bonding material connected to each of the plurality of pads and each of the first to third connection electrodes, and
wherein the bottom surface of the support member is spaced apart from a top surfaces of the plurality of pads.

* * * * *